(12) United States Patent
Ouderkirk et al.

(10) Patent No.: US 9,740,018 B1
(45) Date of Patent: Aug. 22, 2017

(54) LIGHT CONTROL FILM WITH VARIED VIEWING ANGLE

(71) Applicant: 3M INNOVATIVE PROPERTIES COMPANY, St. Paul, MN (US)

(72) Inventors: Andrew J. Ouderkirk, St. Paul, MN (US); Michael J. Sykora, New Richmond, WI (US); Robert R. Kieschke, Woodbury, MN (US); Kenneth L. Smith, White Bear Lake, MN (US); Olester Benson, Jr., Woodbury, MN (US); Gary E. Gaides, Woodbury, MN (US); Tao Liu, Woodbury, MN (US); Thomas J. Blong, Woodbury, MN (US); Gary T. Boyd, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 15/341,159

(22) Filed: Nov. 2, 2016

Related U.S. Application Data

(60) Provisional application No. 62/414,095, filed on Oct. 28, 2016.

(51) Int. Cl.
| | |
|---|---|
| *G02B 27/30* | (2006.01) |
| *H02N 6/00* | (2006.01) |
| *H01L 31/042* | (2014.01) |
| *G02B 27/02* | (2006.01) |
| *G02B 5/00* | (2006.01) |
| *H01L 31/054* | (2014.01) |

(52) U.S. Cl.
CPC ............ *G02B 27/30* (2013.01); *G02B 5/003* (2013.01); *G02B 27/022* (2013.01); *H01L 31/054* (2014.12)

(58) Field of Classification Search
CPC ....... G02B 5/003; G02B 27/022; G02B 27/30
USPC .................. 359/453, 454, 456, 459, 460
See application file for complete search history.

(56) References Cited

U.S. PATENT DOCUMENTS

| | | | |
|---|---|---|---|
| 4,892,387 A | 1/1990 | Takeuchi et al. | |
| 5,103,337 A | 4/1992 | Schrenk et al. | |
| 5,142,415 A | 8/1992 | Koehnle | |
| 5,204,160 A | 4/1993 | Rouser | |
| 6,398,370 B1 * | 6/2002 | Chiu ................ | G02B 5/003 359/601 |
| 8,096,667 B2 | 1/2012 | Boyd et al. | |
| 9,281,186 B2 | 3/2016 | Wootton | |
| 2003/0210535 A1 | 11/2003 | Gaides | |
| 2006/0073891 A1 | 4/2006 | Holt | |

(Continued)

FOREIGN PATENT DOCUMENTS

KR   10-0870290   11/2008

*Primary Examiner* — Eli Mekhlin
(74) *Attorney, Agent, or Firm* — Robert S. Moshrefzadeh

(57) ABSTRACT

A light control film includes a plurality of spaced apart substantially parallel first light absorbing regions arranged along a first direction, each first light absorbing region having a width and a height, the plurality of first light absorbing regions including nonoverlapping first and second sub-pluralities of the plurality of first light absorbing regions, the first sub-plurality of the plurality of first light absorbing regions having a first viewing angle, the second sub-plurality of the plurality of first light absorbing regions having a different second viewing angle.

8 Claims, 33 Drawing Sheets

(56) References Cited

U.S. PATENT DOCUMENTS

| | | | |
|---|---|---|---|
| 2007/0160811 A1* | 7/2007 | Gaides | C08F 290/06 |
| | | | 428/172 |
| 2009/0080056 A1* | 3/2009 | Yahara | C09K 9/02 |
| | | | 359/275 |
| 2009/0284836 A1 | 11/2009 | Boyd et al. | |
| 2010/0201242 A1 | 8/2010 | Liu et al. | |
| 2012/0247541 A1 | 10/2012 | Wootton | |
| 2014/0261636 A1 | 9/2014 | Anderson | |

* cited by examiner

LIGHT CONTROL FILM WITH VARIED VIEWING ANGLE

CROSS REFERENCE TO RELATED APPLICATIONS

This application claims priority from U.S. Provisional Application Ser. No. 62/414,095, filed Oct. 28, 2016, the disclosure of which is incorporated by reference in its/their entirety herein. This application also relates to the following cases: U.S. application Ser. No. 15/341,089, filed Nov. 2, 2016; U.S. application Ser. No. 15/341,201, filed Nov. 2, 2016; U.S. application Ser. No. 15/341,192, filed Nov. 2, 2016; and U.S. application Ser. No. 15/341,171, filed Nov. 2, 2016.

BACKGROUND

Light control film (LCF), also known as light collimating film, is an optical film configured to regulate the transmission of light. LCFs include a light transmissive film having a plurality of parallel grooves formed of a light-absorbing material.

LCFs can be placed proximate a display surface, image surface, or other surface to be viewed. At normal incidence, (i.e. 0 degree viewing angle) where a viewer is looking at an image through the LCF in a direction that is perpendicular to the film surface, the image is viewable. As the viewing angle increases, the amount of light transmitted through the LCF decreases until a viewing cutoff angle is reached where substantially all (greater than about 95%) the light is blocked by the light-absorbing material and the image is no longer viewable. The LCF provides privacy to a viewer by blocking observation by others that are outside a typical range of viewing angles.

SUMMARY

In general, the present disclosure is directed to a light control film (LCF) with varied viewing angle across the film. The varied viewing angle can be achieved by varying at least one of the shape or the pattern of the light absorptive regions in the LCF, or by altering the composition of the light absorbing material in the light absorptive regions. The varied viewing angle can also be produced by utilizing the LCF with a lens array or a multilayer optical film (MOF). Various techniques can be used to alter the pattern of the light absorbing regions including, for example, by changing the master tool used to mold the LCF, or by secondary ink printing. Control over the shape and the arrangement of the light absorptive regions can improve the aesthetic and efficiency of the LCF for a selected end-use.

In one aspect, the present disclosure is directed to a light control film including a plurality of spaced apart substantially parallel first light absorbing regions arranged along a first direction, each first light absorbing region having a width and a height, the plurality of first light absorbing regions including nonoverlapping first and second sub-pluralities of the plurality of first light absorbing regions, the first sub-plurality of the plurality of first light absorbing regions having a first viewing angle, the second sub-plurality of the plurality of first light absorbing regions having a different second viewing angle.

In another aspect, the present disclosure is directed to a light control film including a plurality of spaced apart substantially parallel first light absorbing regions disposed between major first and second surfaces of the light control film, each first light absorbing region having a width W, a height H and a length L, H/W≥1, L/H≥20, such that for an image displayed through the light control film, the image having sequential first, second and third image portions, a same characteristic of the image portions changes less for the first and third image portions and more for the second image portion when moving from viewing the image at a first viewing angle to viewing the image at a different second viewing angle.

In another aspect, the present disclosure is directed to a light control film including a plurality of spaced apart substantially parallel first light absorbing regions disposed between major first and second surfaces of the light control film, each first light absorbing region having a width W, a height H and a length L, H/W≥1, L/H≥20, each first light absorbing region comprising a multilayer stacked in the thickness direction of the first light absorbing region, the multilayer comprising a first layer substantially absorbing light in a first predetermined wavelength range and substantially transmitting light in a different second predetermined wavelength range, and a second layer disposed on the first layer and substantially absorbing light in the second predetermined wavelength range and substantially transmitting light in the first predetermined wavelength range.

In another aspect, the present disclosure is directed to a light control film including a plurality of spaced apart substantially parallel first light absorbing regions disposed between major first and second surfaces of the light control film, each first light absorbing region having a width W, a height H and a length L, H/W≥1, L/H≥20, at least one first light absorbing region substantially absorbing light in a first predetermined wavelength range and substantially transmitting light in a different second predetermined wavelength range, and at least one other first light absorbing region substantially absorbing light in the second predetermined wavelength range and substantially transmitting light in the first predetermined wavelength range.

In another aspect, the present disclosure is directed to a light control film including a plurality of spaced apart substantially parallel first light absorbing regions disposed between major first and second surfaces of the light control film, each first light absorbing region having a width W, a height H and a length L, H/W≥1, L/H≥20, at least for one first light absorbing region, the first light absorbing region having a first color at a first temperature in a predetermined temperature range and a different second color at a different second temperature in the predetermined temperature range.

In another aspect, the present disclosure is directed to a light control film including alternating light absorbing and light transmissive regions disposed between, and substantially perpendicular to, substantially parallel opposing major first and second surfaces, each light absorbing region tapering from a wider first end proximate the major first surface to a narrower second end proximate the major second surface, each light transmissive region terminating at, and aligned with, a corresponding optical lens at the major first surface, the first end of each light absorbing region recessed relative to a base of the optical lens on each lateral side of the light absorbing region and concave toward the major first surface.

In another aspect, the present disclosure is directed to an optical construction including: a light control film including a plurality of spaced apart first light absorbing regions, each first light absorbing region substantially absorbing light in a first predetermined wavelength range and substantially transmitting light in a nonoverlapping second predetermined wavelength range; and an optical filter disposed on the light control film and substantially transmitting light in the first predetermined wavelength rage and substantially reflecting light in a nonoverlapping third predetermined wavelength range, the third predetermined wavelength range partially overlapping the second predetermined wavelength range.

In another aspect, the present disclosure is directed to an optical construction including: a light control film including alternating light absorbing and light transmissive regions; and a lens sheet disposed on the light control film and including a plurality of lenses, each lens corresponding to and aligned with a different light transmissive region, a minimum lateral spacing between each pair of sequential light transmissive regions being w, a maximum lateral spacing between the lenses corresponding to the pair of sequential light transmissive regions being d, wherein d/w≤1.

In another aspect, the present disclosure is directed to a light control film including alternating light absorbing and light transmissive regions and a plurality of unitary lenses, each unitary lens disposed on and aligned with a different light transmissive region and including: a light focusing portion primarily for focusing light toward the light transmissive region corresponding to the lens; and a bonding portion primarily for bonding the lens to a surface.

In another aspect, the present disclosure is directed to an optical construction, including: a solar cell including a plurality of electrodes extending across the solar cell; and a light control film disposed on the solar cell and having a plurality of first light absorbing regions, each first light absorbing region having a width W, a height H and a length L, H/W≥1, L/H≥20, each first light absorbing region substantially coextensive and aligned with a corresponding electrode in the plurality of electrodes.

In another aspect, the present disclosure is directed to an optical construction, including: a solar cell; and a light control film disposed on the solar cell and substantially coextensive with the solar cell along a length and a width of the light control film, the light control film having a plurality of spaced apart substantially parallel first light absorbing regions, each first light absorbing region having a width W, a height H and a length L, H/W≥1, L/H≥20, each first light absorbing region forming an angle with a line normal to the solar cell in a range from about 5 degrees to about 40 degrees.

In another aspect, the present disclosure is directed to a light control film including a plurality of spaced apart substantially parallel first light absorbing regions and a plurality of spaced apart substantially parallel second light absorbing regions, each first and second light absorbing region having a width W, a height H and a length L, H/W≥1, L/H≥20, each first light absorbing region forming a same first angle with a line normal to a plane of the light control film, each second light absorbing region forming a different same second angle with the line.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like symbols in the figures refer to like elements.

DETAILED DESCRIPTION

Figure 1:
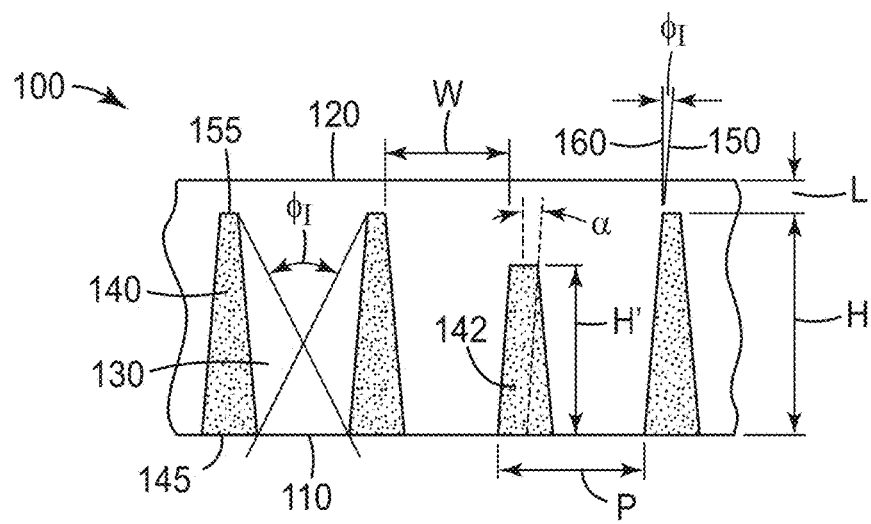
FIG. 1 is a schematic, cross-sectional view of a light control film (LCF).

FIG. 1 shows a cross-sectional view of a LCF 100 that includes a light output surface 120 and a light input surface 110 opposite light output surface 120. While described herein as light input surface and light output surface for reference purposes, the LCFs described herein may have either a light output surface or a light input surface facing a viewer. The LCF 100 includes alternating light transmissive regions 130, light absorptive regions 140, and an interface 150 between transmissive regions 130 and absorptive regions 140. While this application refers to light transmissive regions in some embodiments, light transmission through the transmissive regions 130 includes diffusive scattering.

The transmissive regions 130 have a base width "W" disposed apart from each other by a pitch "P", and include a land region "L" between absorptive regions 140 and light output surface 120. The absorptive regions 140 have a base 145, a top surface 155, heights "H" and "H'" and are displaced apart from each other by pitch "P". Interface 150 forms an interface angle $\theta_I$ with a normal 160 to light output surface 120. As described herein, by "normal" to a surface is meant perpendicular to the major plane of the surface, discounting any local variation is surface smoothness. The LCF 100 includes an internal viewing cutoff angle $\phi_I$ defined by the geometry of alternating transmissive regions 130 and absorptive regions 140. In this embodiment, absorptive region 142 corresponds to a portion of an indicium and has a height "H'" that is less than height "H". The height H' can be zero height.

In the embodiment of FIG. 1, the absorptive regions 140 are oriented substantially perpendicular to the light input surface 110 and the light output surface 120. In other embodiments, the absorptive regions may be angled at an angle α with respect to either of the light input surface 110 or the light output surface 120.

Figure 2:
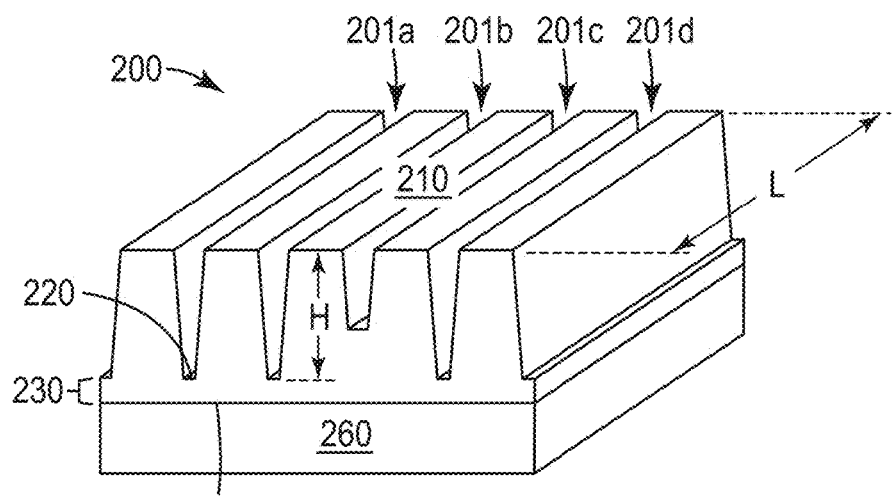
FIG. 2 is a schematic perspective view of a microstructured film article suitable for making a LCF.

FIG. 2 shows a microstructured film article 200 including at least one microstructured surface 210, which can be used to make a LCF. In one embodiment, microstructured surface 210 can include a plurality of grooves 201a-201d. In this embodiment, groove 201c has less depth than grooves 201a, 201b and 201d. FIG. 2 is not drawn to scale, and the length L of the grooves is substantially greater than the height H of the grooves. In various embodiments, the ratio of L/H is ≥20, or ≥100, or ≥1000.

In various embodiments, the LCF may be fabricated using a microreplication process in which a polymeric material is cast on a microstructured tool, by injection molding, by linear extrusion, or a combination of these techniques.

As shown in FIG. 2, a continuous land layer 230 can be present between the base of the grooves 220 and the opposing surface 211 of microstructured film article 200. The base of the grooves 220 may alternatively extend all the way through the microstructured film article 200 (not shown). The microstructured film article 200 may also include a base substrate layer 260, which can be integrally formed with, or separately added to microstructured film article 200 (whether by extrusion, cast-and-cure, or some other method).

Figure 3:
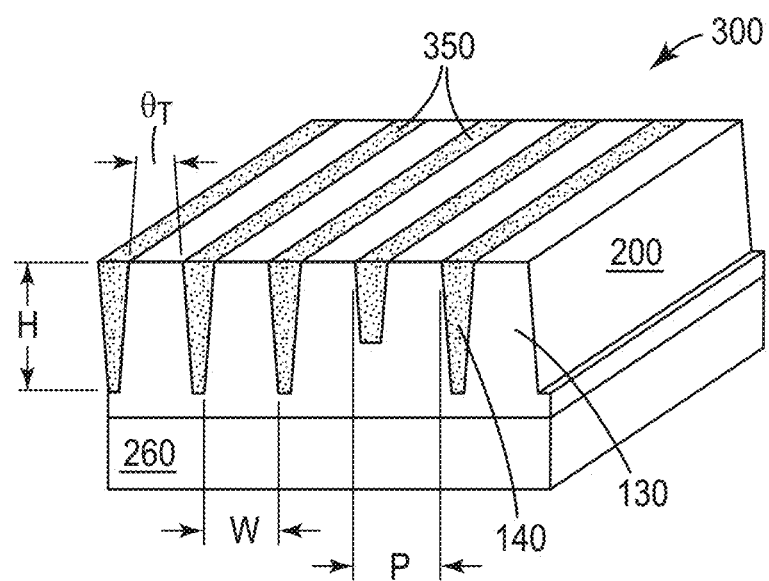
FIG. 3 is a schematic perspective view of a microstructured film article having grooves filled with a light absorbing material to form a LCF.

FIG. 3 shows an LCF 300 wherein grooves 201a-201d of FIG. 2 have been rendered light-absorbing by filling them with light absorbing material 350. Light absorbing material 350 in the shape of grooves 201a-201d of microstructured film 200 is hereinafter referred to as absorptive region 140. In this embodiment, the absorptive regions have lengths that correspond to the lengths of the transmissive regions.

Figure 4A:
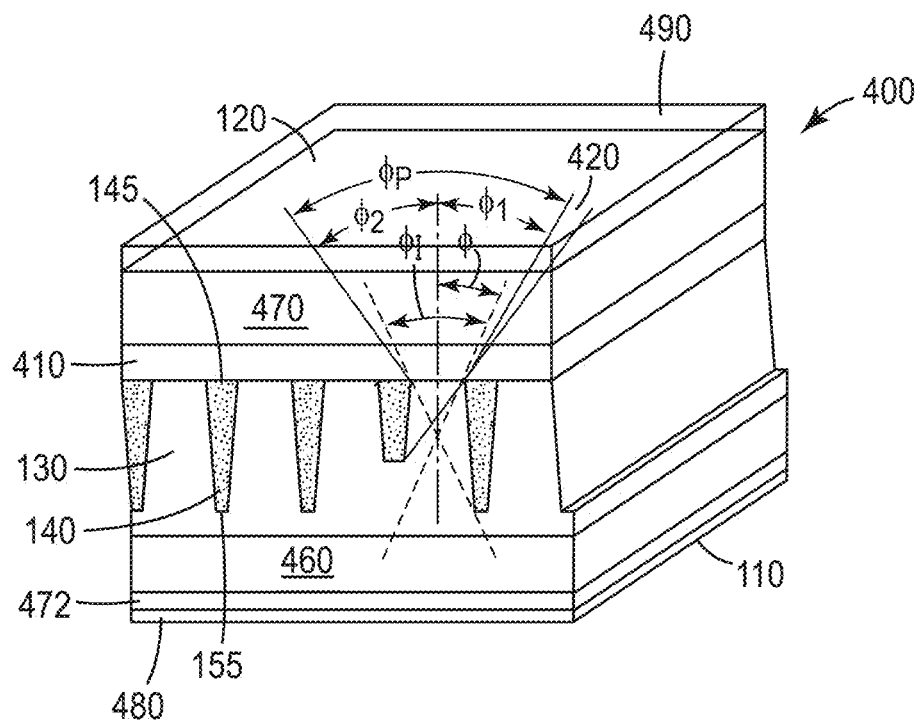
FIG. 4A is a schematic view of an optical article including a LCF and additional optical layers.

FIG. 4A shows a LCF 400 with an optional cover layer 470 that can be the same material as, or different than, a base substrate layer 460. In the embodiment of FIG. 4A, the LCF 400 includes light input surface 110 and light output surface 120 opposite light input surface 110, together defining a major plane. In another embodiment not shown in FIG. 4A, the surface 110 is the light output surface and the surface 120 is the light input surface, but the arrangement in FIG. 4A can be more efficient due to total internal reflection (TIR). In one embodiment, which is not intended to be limiting, the materials for the cover layer 470 or base substrate layer 460 may include commercially available polycarbonate films, which may be selected to provide a matte finish or a glossy finish. The cover layer 470 and base substrate layer 460 may either or both be matte or glossy. Any of the four combinations are contemplated herein.

The optional cover layer 470 can be bonded to the LCF 400 with an adhesive layer 410. In various embodiments, the adhesive 410 can be any optically clear adhesive, such as a UV-curable acrylate adhesive, a transfer adhesive, and the like.

In another embodiment, the LCF 400 may be applied over a solar cell 482. In such a construction, the cover layer 470 can be selected to reflect ranges of wavelengths over the solar spectrum, including ultraviolet, blue, and infrared (IR) wavelengths of greater than 1200 nm to more effectively control the temperature of the LCF 400. Alternatively, the substrate layer 460 may reflect ranges of the solar spectrum. Another alternative is to apply a reflective coating or film 472 on the solar cell 482 that is below the LCF 400.

When the LCF 400 is applied over the solar cell 482, suitable materials for either the cover layer 470, or the substrate layer 460, or both for reflecting portions of the solar spectrum include polymeric multilayer optical film, available from 3M Company, or dichroic interference coatings as known in the art. The films and coatings may reflect a combination of one or more of the ranges in the ultraviolet, blue, and IR wavelengths. In various embodiments, the infrared range that is reflected is above 1000 nm, or greater than 1100 nm, or greater than 1200 nm. The reflected wavelength range is herein defined as the 50% reflectivity band edge measured at an angle normal to the film plane. The film and coating may have a band edge shift for light incident at off-normal angles, which may be desirable for reflectors that reflect in the ultraviolet or the blue, or both, since sunlight incident at normal incidence may result in the highest solar cell temperature, and the reflection will reduce cell temperature, at least partially compensating for the reduced light exposure on the solar cell. As the light angle changes to increasingly non-normal angles, cell temperature rise due to sunlight exposure will decrease, and the solar cell efficiency can be increased due to a combination of lower temperature and increased light transmission due to the band shift of the reflection of the film or coating.

A surprising benefit of placing the reflective film or coating 472 between the solar cell 480 and the LCF 400 is that the LCF 400 can hide or obscure and reflection in the visible portion of the spectrum. Reducing this reflection can be important for both aesthetics and safety.

Figure 4B:
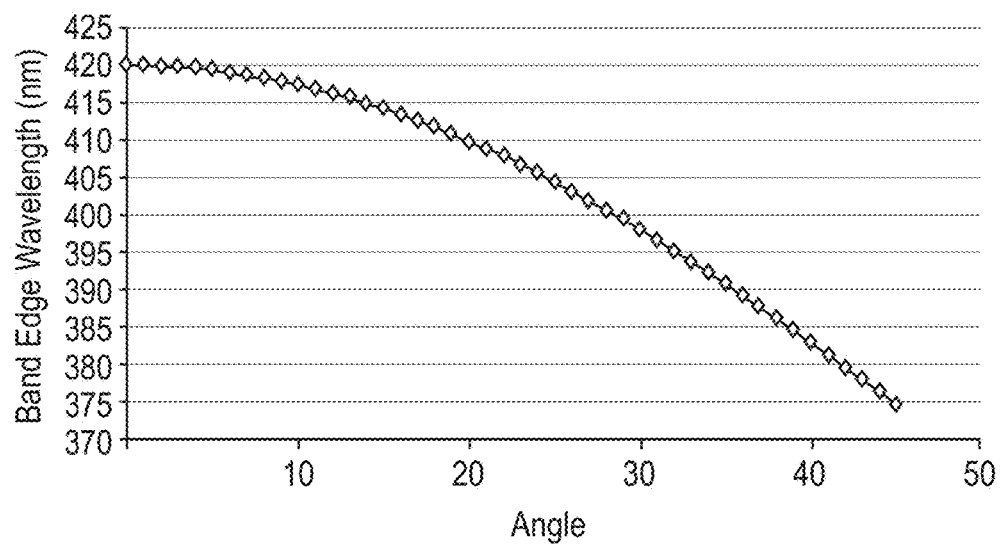
FIG. 4B shows band edge as a function of angle for a multilayer optical film.

FIG. 4B shows the shift in the right-hand band edge of a blue light reflective polyethylene terephthalate-based polymeric multilayer optical film, available from 3M Company.

Figure 4C:
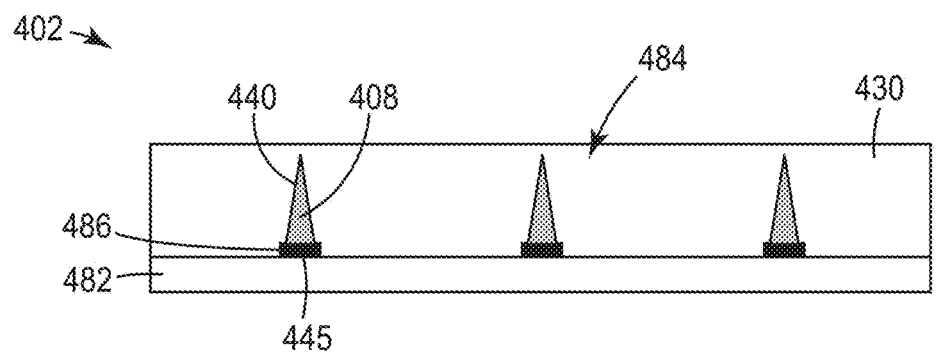
FIG. 4C is a schematic of a LCF combined with a solar cell.

The solar cell may have a combination of wider conductive busbars and narrower conductive fingers to make an electrical connection with a front junction of the solar cell. The fingers or the busbar, or both, may be covered with a LCF as shown in FIG. 4C. A louvered solar cell 402 includes a solar cell 482 with masked conductive lines 484. The masked conductive lines 484 are made of a conductor 486 with a louver-like light absorptive region 440 in a light transmissive matrix 430. In various embodiments, the light absorptive regions 440 can have an index of refraction that is substantially matched with the index of the light transmissive regions of the matrix 430, or has a lower index than the light transmissive matrix 430. In various embodiments, the light absorptive regions 440 have a refractive index that is at least 0.1 less than the light transmissive matrix 430, or a refractive index is at least 0.2 less than the light transmissive matrix 430. In some embodiments, the light absorptive regions 440 may also contain a pigment 408. The pigment may in an internal area of the light transmissive region 440, as shown in FIG. 4B, or may be distributed in the material making up the light transmissive regions 440.

The louver-like light transmissive regions 440 may be made either by additive methods or by molding. Suitable additive methods include the process of first generating the conductors 486 on the solar cell 480. A mold may then be prepared using a releasable material such as, for example, polydimethylsilicone (PDMS), that has appropriate features for forming the light transmissive regions 440 in registration with the conductors 486, filling the light transmissive regions 440 with the materials that will form the regions 440 on the solar cell 482, then transferring the light transmissive regions 440 to the solar cell 482. In some embodiments, the PDMS may be backed with glass to allow precise and accurate registration of the light transmissive regions 440 with the conductors 486.

In various embodiments, the light absorptive regions 440 may be formed from solvent-based materials, or curable materials, or a combination thereof. The light absorptive regions 440 may be formed by coating the mold with a thin layer of a light absorptive material, optionally removing excess material from the mold such that light absorptive material is only in the light absorptive regions, and optionally repeating the coating step with a pigment containing material. The mold with the filled light absorptive regions may then be registered and applied to the solar cell 482, the light absorptive regions can be bonded to the conductors 486 using heat, pressure, or actinic radiation, or a combination thereof, and the mold may be released to form the light absorptive regions.

The light absorptive regions may then be coated with the desired light transmissive matrix material, which in some non-limiting embodiments is a curable or thermoplastic resin or adhesive. Suitable materials for the light transmissive matrix include, but are not limited to, fluoropolymers, silicone polymers, acrylates, and thermoplastics such as ethylene vinyl acetate (EVA).

An alternative method of manufacture is to fill the light absorptive regions of the mold as described above, and form conductive lines 486 on at least some or all the light absorptive regions using, for example, silver particle containing inks. The mold may then be applied to the solar cell.

As shown in FIG. 4C, the light absorptive regions 440 may have a base portion 445 in contact with the conductive line 486 that is the same size as the conductive line 486. In another embodiment, the bases 445 of the light absorptive regions 440 may be larger than the conductive line 486.

A surprising advantage of the TIR promoted by the index of refraction of the light absorptive regions 440 relative that of the light transmissive matrix 430 is that the size of the light absorptive regions 440 can be increased without substantially reducing the optical efficiency of the solar cell 482, and the larger size of the light transmissive regions 440 will increase the tolerance in registration of the mold transfer of the light transmissive regions 440 to the conductive lines 486.

Referring again to FIG. 4A, in some embodiments either or both major surfaces of the cover layer 470 can also include a surface coating layer 490. In example, the surface coating layer 490 can be a diffusive material laminated to the cover layer 470 with a suitable optical adhesive. In some embodiments, it can be advantageous to minimize the index of the bonding medium between the surface coating layer 490 and the cover layer 470, or to use an ultra-low index film (ULI) or layer (not shown in FIG. 4A) bonded to the adhesive layer. An attached matte film 490 on the cover layer 470 has the beneficial effects of coupling light into the light absorptive regions 140 from high angles, which can increase the interaction with the regions 140 (improved uniformity and reduced shadowing), and sending more collected energy to an underlying solar cell 480. In various embodiments, a diffusive surface coating layer 490 can collect light from along the direction of the light absorptive regions 140, can reduce glare, and can enhance ink reception of any surface color bands above the absorptive regions 140.

In some embodiments, the surface coating layer 490, which can optionally be diffusive, could include surface microstructures to modify the diffusion angles of light emitted from the LCF construction 400. In some embodiments, the surface coating layer 490 could be at least one of an antireflective coating or film, or at least one of an anti-glare coating or film.

In some embodiments, the surface coating layer 490, the cover layer 470, or both, could include optional additives such as, for example, UV absorbers to reduce photo degradation of the light absorbing materials in the absorptive layers 140 and the light transmissive materials 130, anti-microbial additives, and plasticizers to enhance flexibility and reduce cracking when the LCF construction 400 is exposed to extreme temperature and humidity changes.

As shown in FIGS. 1 and 4A (and more particularly labeled in FIG. 1), transmissive regions 130 between absorptive regions 140 have an included wall angle $\theta_T$, a transmissive region base width "W", an effective height "H", a pitch "P" (each shown in FIG. 2), and a polar viewing cutoff angle $\phi_P$ (shown in FIG. 4). Included wall angle $\theta_T$ is two times the interface angle $\theta_I$ shown in FIG. 2 for symmetric absorptive regions. In one case, interface angle $\theta_I$ can be different for each interface 150, and included wall angle $\theta_T$ is equal to the sum of the interface angles $\theta_I$ on each side of absorptive region 140, for an unsymmetrical absorptive region. Polar viewing cutoff angle $\phi_P$ can be determined by applying Snell's law to the rays defining the internal viewing cutoff angle $\phi_I$, using the indices of refraction of optional cover film 470, adhesive 410, transmissive regions 130, base substrate layer 260, and the material that LCF 400 is immersed in (typically air). Polar viewing cutoff angle $\phi_P$ is equal to the sum of a polar viewing cutoff half angle $\phi_1$ and a polar viewing cutoff half angle $\phi_2$ each of which are measured from the normal to light input surface 110.

In some cases, polar viewing cutoff angle $\phi_P$ can be symmetric, and polar viewing cutoff half angle $\phi_1$ is equal to polar viewing cutoff half angle $\phi_2$. In some cases, polar viewing cutoff angle $\phi_P$ can be asymmetric, and polar viewing cutoff half angle $\phi_1$ is not equal to polar viewing cutoff half angle $\phi_2$.

Figure 6:
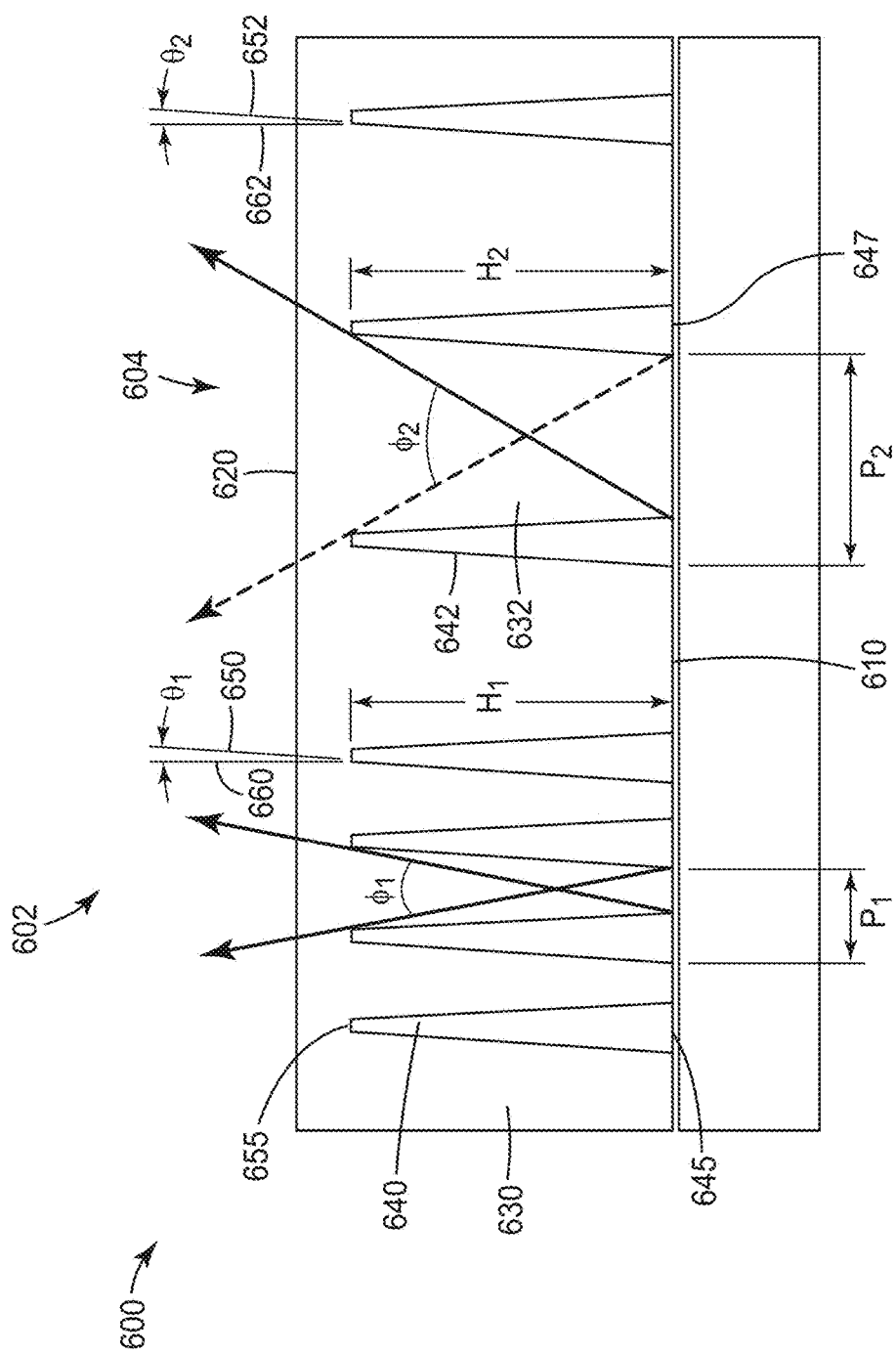
FIG. 6 is a schematic cross-sectional view of a LCF with light absorbing regions having varying pitch and constant height.

For the purposes of this disclosure, an angle "$\phi$" shown in FIG. 6 and measured from the normal to light input surface 110 along the direction shown, is herein referred to as a "polar viewing angle". The polar viewing angle $\phi$ can range from 0° (i.e. normal to light input surface 110) to 90° (i.e. parallel to light input surface 110).

The material properties of transmissive regions 130, included wall angle $\theta_T$, pitch "P", and transmissive region base width "W" can impact light transmission through LCF 400. LCFs can have relatively large included wall angles, such as greater than 10 degrees or more. Larger wall angles increase the width of the light absorbing regions, thereby decreasing transmission at normal incidence. Smaller wall angles are preferred, such as less than 10 degrees, so that the transmission of light at normal incidence can be made as large as possible. In some embodiments, LCFs described herein have an included wall angle of not greater than 6°. In other embodiments, the included wall angle is not greater than 5°, such as up to 5°, 4°, 3°, 2°, 1° or 0.1°. As described herein, the included wall angle can be related to the interface angle for symmetric and asymmetric absorptive regions. As such, in one aspect, the interface angle can be 3°, or not greater than 3°, for example not greater than 2.5°, 2°, 1°, or 0.1°. Smaller wall angles can form grooves having a relatively high aspect ratio (H/W) at a smaller pitch "P", and can provide a sharper image cutoff at lower viewing angles. In some cases, the transmissive regions have an average height, "H", and an average width at its widest portion, "W", and in various embodiments H/W is at least 1.0, or at least 1.75, or at least 2.0, 2.5, 3.0 or greater.

LCFs can be made to have any desired polar viewing cutoff angle. In one aspect, the polar viewing cutoff angle ranges from 40° to 90° or even higher. The polar viewing cutoff angle $\phi_P$, can be determined by the parameters "$\theta_I$", "H", "W", "P", and the indices of the LCF materials.

In some cases, it can also be useful to define an "effective polar viewing angle" which includes light transmitted through the LCF at angles larger than the polar viewing cutoff angle. For example, light that intercepts the absorptive regions at angles slightly larger than the internal viewing cutoff angle (pi can "bleed through" the thinnest portions of the absorptive region (i.e. partially transmit through the top and bottom of the light absorbing regions represented as trapezoids shown in FIG. 1). Further, light traveling normal to the plane of the LCF may scatter and stray outside the effective polar viewing angle. The effective polar viewing angle as used herein is defined as the angle at which the relative brightness ratio decreases to 5% or less. The relative brightness ratio is the ratio (expressed as a percentage) of the brightness of a diffuse light source as measured through an LCF to the brightness of the same diffuse light source as measured without the LCF. The specifics of the relative brightness ratio measurement are further described in the Examples below.

Light absorbing materials for the light absorbing regions in LCFs can be any suitable material that functions to absorb or block light at least in a portion of the visible spectrum. In some embodiments, the light absorbing material can be coated or otherwise provided in grooves or indentations in a light transmissive film to form light absorbing regions. In further embodiments, light absorbing materials can include a black colorant, such as carbon black. The carbon black may be a particulate carbon black having a particle size less than 10 microns, for example 1 micron or less. The carbon black may, in some embodiments, have a mean particle size of less than 1 micron.

In another embodiment, the light absorbing materials can include a colorant having other colors such as white, red, green, or yellow. In yet further embodiments, the absorbing material, (e.g., carbon black, another pigment or dye, or combinations thereof) can be dispersed in a suitable binder. Light absorbing materials also include particles or other scattering elements that can function to block light from being transmitted through the light absorbing regions. For example, in some embodiments, larger particles, on the order of ≥0.1 times the width of the light absorptive regions 140, can aid with scattering light toward an underlying substrate such as a solar cell, and can obscure the solar cell from direct or indirect view. In some embodiments, the larger particles may be of a different color, to give a speckled appearance to the LCF 400.

In various embodiments, the refractive index of the light absorbing material in the light absorptive regions 140 can be the same as or lower than the refractive index of the light transmissive regions 130. In some embodiments, a lower refractive index is used to promote total internal reflection (TIR) at the interface 150 to increase optical efficiency. In some embodiments, the light absorbing material in the light absorptive regions 140 can be selected to allow transmission of infrared (IR) wavelengths of light at least up to 1200 nm.

In some embodiments, reflections at the light transmissive region/light absorbing region interface can be controlled by mismatching the relative index of refraction of the light transmissive material and the index of refraction of the light absorbing material over at least a portion of the spectrum, for example the human visible spectrum. In some cases, the index of refraction of the cured transmissive regions (N1) is greater than the index of refraction of the cured light absorptive regions (N2) by less than about 0.005. In such cases, the index of refraction difference, (N2−N1) is not less than −0.005, or, (N2−N1) is greater than or equal to −0.005.

As noted above, LCFs can be made to have any desired polar viewing cutoff angle $\phi_P$ by varying one or more of the parameters "$\theta_I$", "H", "W", "P", and the indices of the LCF materials. In some embodiments, if the LCF includes a plurality of light absorbing dark regions, a first portion or sub-plurality of the light absorbing regions can be configured to have a first polar viewing cutoff angle $\phi_{P1}$ that is different from a second polar viewing cutoff angle $\phi_{P2}$ of a second sub-plurality of light absorbing regions. When the resulting LCF is viewed from a distance, for an observer viewing the LCF at an angle greater than the polar viewing cutoff angle $\phi_{P1}$ and smaller than polar viewing cutoff angle $\phi_{P2}$, patterns defined by the second sub-plurality of light absorbing regions can be visible. The LCF can be configured to include any number of sub-pluralities of light absorbing regions, or even a gradient of light absorbing regions.

Figure 5:
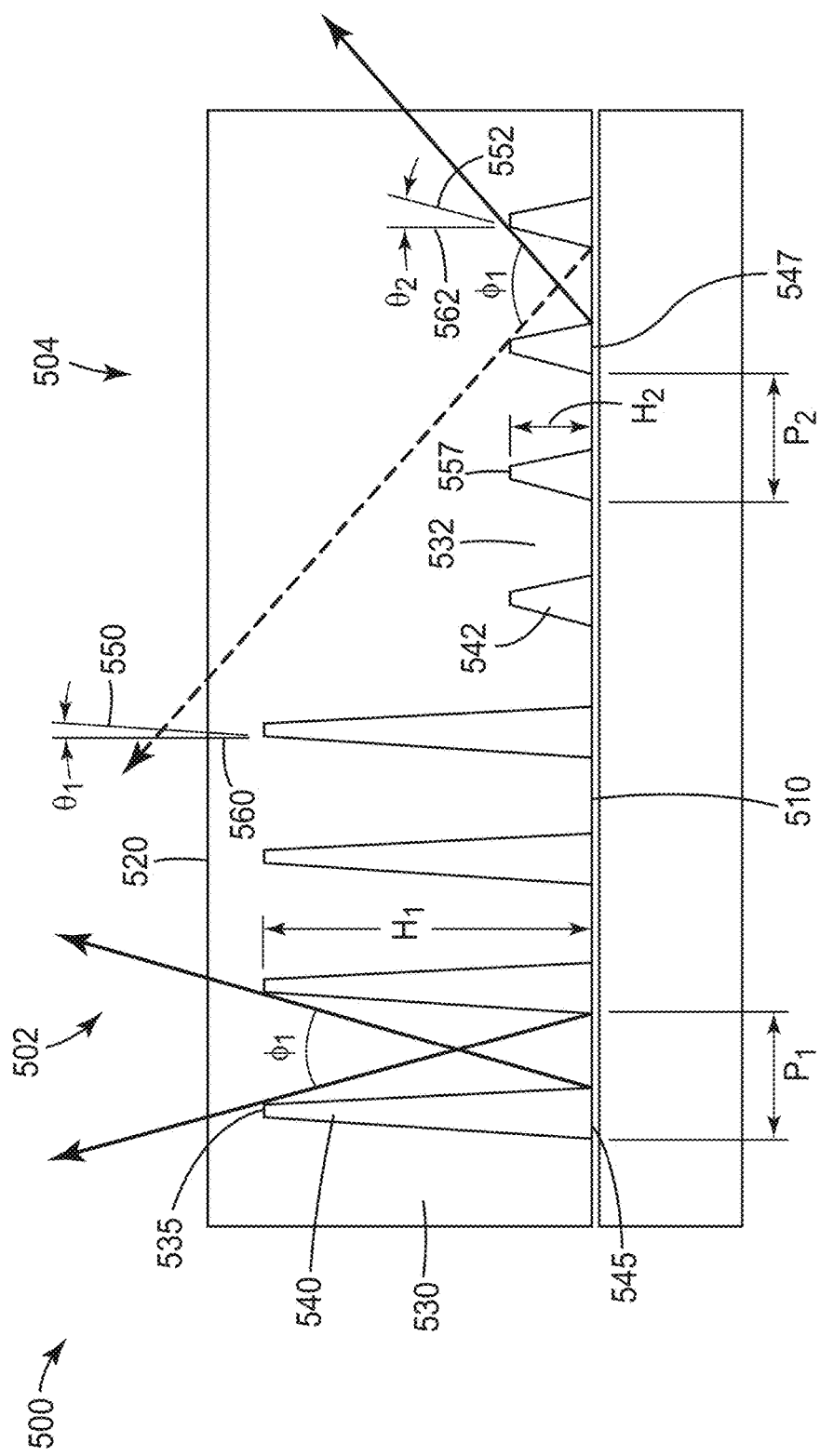
FIG. 5 is a schematic cross-sectional view of a LCF with light absorbing regions having varying height and constant pitch.

Referring to FIG. 5, a LCF 500 includes a light output surface 520 and a light input surface 510. While described herein as light input surface and light output surface for reference purposes, the LCFs described herein may have either a light output surface or a light input surface facing a viewer. The LCF 500 includes a plurality of alternating light transmissive regions and light absorptive regions, including a first sub-plurality of light absorptive regions 502 and a second sub-plurality of light absorptive regions 504.

The first sub-plurality of light absorptive regions 502 includes light transmissive regions 530 and light absorptive regions 540, and an interface 550 between transmissive regions 530 and absorptive regions 540. The light absorptive regions 540 have a base 545, a top surface 555, and a height $H_1$, and are disposed apart from each other by a pitch $P_1$. Interface 550 forms an interface angle $\theta_1$ with a normal 560 to the light output surface 520. The first sub-plurality of light absorptive regions 502 includes an internal viewing cutoff angle $\phi_1$ defined by the geometry of alternating transmissive regions 530 and absorptive regions 540.

The second sub-plurality of light absorptive regions 504 includes light transmissive regions 532 and light absorptive regions 542, and an interface 552 between transmissive regions 532 and absorptive regions 542. The light absorptive regions 542 have a base 547, a top surface 557, and a height $H_2$, and are disposed apart from each other by a pitch $P_2$. Interface 552 forms an interface angle $\theta_I$ with a normal 562 to light output surface 520. The second sub-plurality of light absorptive regions 502 includes an internal viewing cutoff angle $\phi_2$ defined by the geometry of alternating transmissive regions 532 and absorptive regions 542. The second sub-plurality of light absorptive regions 502 includes an internal viewing cutoff angle $\phi_2$ defined by the geometry of alternating transmissive regions 532 and absorptive regions 542.

In the embodiment of FIG. 5, the height $H_1$ of the absorptive regions 540 in the first sub-plurality 502 is greater than the height $H_2$ of the absorptive regions 542 in the second sub-plurality 504. The pitch $P_1$ of the absorptive regions 540 in the first sub-plurality 502 is the same as the pitch $P_2$ of the absorptive regions 542 in the second sub-plurality 504. As a result of the relative geometry between the first and the second sub-pluralities of absorptive regions 502, 504, the internal viewing cutoff angle $\phi_2$ of the second sub-plurality 504 is greater than the internal viewing cutoff angle $\phi_1$ of the first sub-plurality 502.

Referring to FIG. 6, a LCF 600 includes a light output surface 620 and a light input surface 610. The LCF 600 includes a plurality of alternating light transmissive regions and light absorptive regions, including a first sub-plurality of light absorptive regions 602 and a second sub-plurality of light absorptive regions 604.

The first sub-plurality of light absorptive regions 602 includes light transmissive regions 630 and light absorptive regions 640, and an interface 650 between transmissive regions 630 and absorptive regions 640. The light absorptive regions 640 have a base 645, a top surface 655, and a height $H_1$, and are disposed apart from each other by a pitch $P_1$. Interface 650 forms an interface angle $\theta_1$ with a normal 660 to the light output surface 620. The first sub-plurality of light absorptive regions 602 includes an internal viewing cutoff angle $\phi_1$ defined by the geometry of alternating transmissive regions 630 and absorptive regions 640.

The second sub-plurality of light absorptive regions 604 includes light transmissive regions 632 and light absorptive regions 642, with an interface 652 therebetween. The light absorptive regions 642 have a base 647, a top surface 657, and a height $H_2$, and are disposed apart from each other by a pitch $P_2$. Interface 652 forms an interface angle $\theta_1$ with a normal 662 to light output surface 520. The second sub-plurality of light absorptive regions 602 includes an internal viewing cutoff angle $\phi_2$ defined by the geometry of alternating transmissive regions 632 and absorptive regions 642. The second sub-plurality of light absorptive regions 602 includes an internal viewing cutoff angle $\phi_2$ defined by the geometry of alternating transmissive regions 632 and absorptive regions 642.

In the embodiment of FIG. 6, the height $H_1$ of the absorptive regions 640 in the first sub-plurality 602 is the same as the height $H_2$ of the absorptive regions 642 in the second sub-plurality 604. The pitch $P_1$ of the absorptive regions 640 in the first sub-plurality 602 is less than the pitch $P_2$ of the absorptive regions 642 in the second sub-plurality 604. As a result of the relative geometry between the first and the second sub-pluralities of absorptive regions 602, 604, the internal viewing cutoff angle $\phi_2$ of the second sub-plurality 604 is greater than the internal viewing cutoff angle $\phi_1$ of the first sub-plurality 602.

In various embodiments, a larger internal viewing cutoff angle $\phi$ can enhance the optical efficiency of the LCF since large pitch or smaller heights of the light absorptive regions will increase light transmission.

Figure 7:
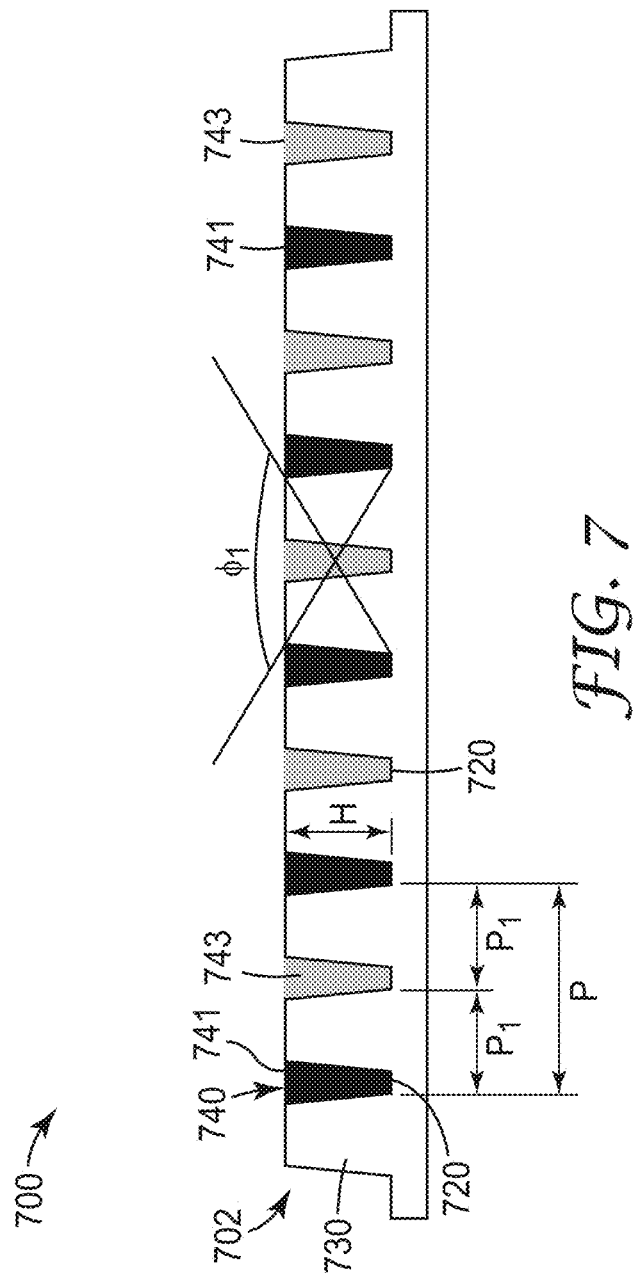
FIG. 7 is a schematic, cross-sectional view of a LCF having light absorbing regions filled with different light absorbing materials.

FIG. 7 illustrates another embodiment of a LCF 700 that includes a first sub-plurality of light absorptive regions 702 that includes light absorptive regions 740 and regions 730 that can have light transmissive, scattering or diffusively reflective properties. The first sub-plurality 702 includes grooves 720 with a pitch $P_1$ and a substantially constant height H. Alternating grooves are filled with a first light absorbing material 741 to form the light absorptive regions 740. The grooves 720 between the light absorptive regions can remain unfilled, or can be filled with a second light absorbing material 743. In the embodiment of FIG. 7, the second light absorbing material 743 absorbs less light over a predetermined wavelength range (and transmits much more light over the predetermined wavelength range) than the first light absorbing material 741, thus forming an effective pitch P between adjacent light absorbing regions 740 that is twice the pitch $P_1$ between the grooves 720. The first sub-plurality of light absorbing regions 702 has an internal viewing cutoff angle $\phi_1$ between adjacent light absorptive regions 740.

In a second region of the LCF 700, which for clarity is not shown in FIG. 7, a second sub-plurality of light absorptive regions are formed by filling every groove with the first light absorbing material to form light absorptive regions having a pitch that is half the effective pitch P between adjacent absorptive regions in the first sub-plurality 702. The internal viewing cutoff angle of the second sub-plurality is thus smaller than the internal viewing cutoff angle $\phi_1$ of the first sub-plurality 702.

Figure 8A:
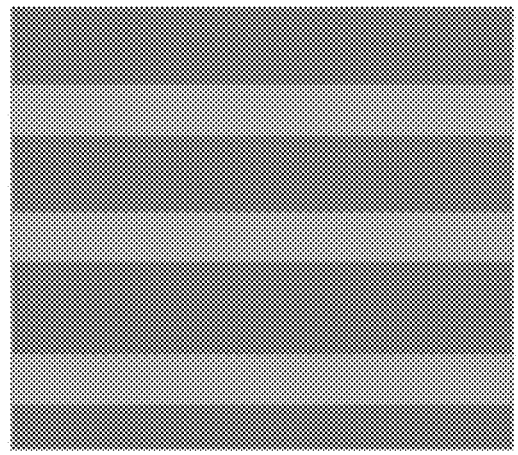
FIGS. 8A-8C are example overhead views of images that may be formed using the LCFs of the present disclosure.
Figure 8B:
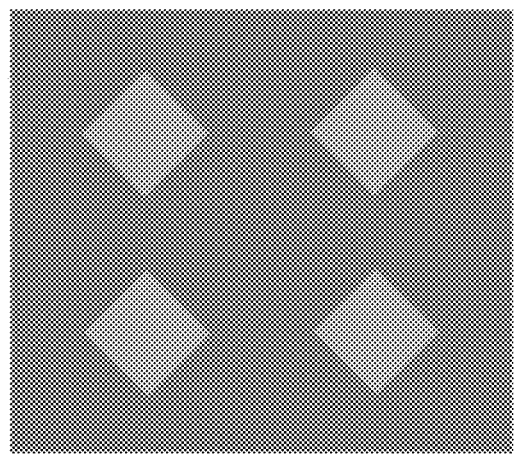
Figure 8C:
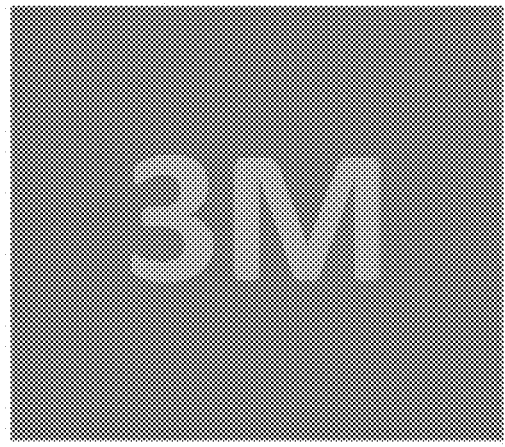

Referring now to FIGS. 8A-8C, a wide variety of sub-pluralities of light absorptive regions may be formed in a LCF, each sub-plurality forming an image portion that is displayed through the LCF and observable by a viewer at a selected viewing angle. The image may be one-dimensional (FIG. 8A), two-dimensional (FIG. 8B), or may be graphical (FIG. 8C). In various embodiments, which are not intended to be limiting, the images observed by the viewer may include differing image characteristics such as color, brightness and combinations thereof. In some embodiments, the displayed through the LCF may include sequential first, second and third image portions, a same characteristic of the image portions changes less for the first and third image portions and more for the second image portion when moving from viewing the image at a first viewing angle to viewing the image at a different second viewing angle.

Figure 9:
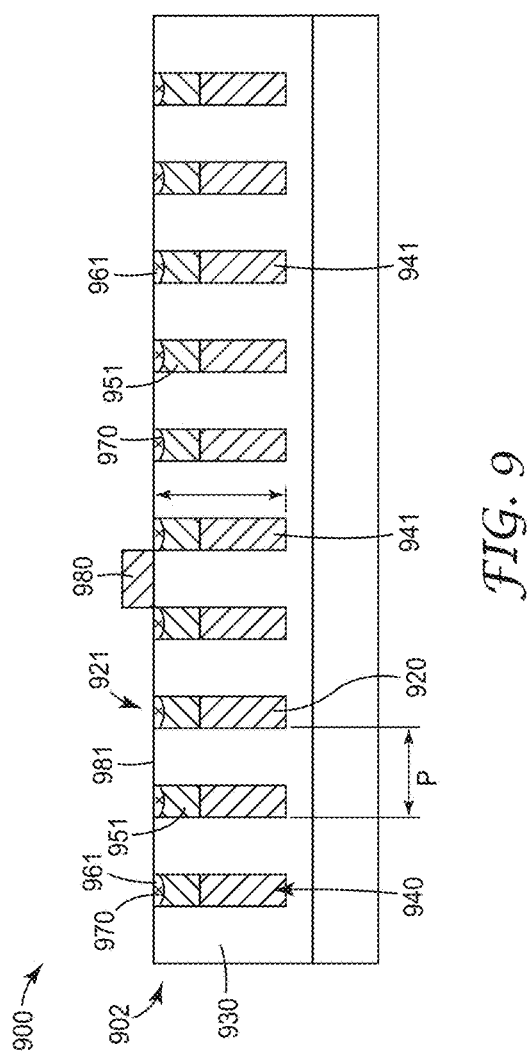
FIG. 9 is a schematic, cross-sectional view of a LCF with light absorbing regions having different light absorbing materials therein.

Referring to FIG. 9, a LCF 900 includes a first sub-plurality of light absorptive regions 902 with includes light transmissive regions 930 and light absorptive regions 940. The first sub-plurality 902 includes grooves 920 with a pitch P and a substantially constant height H. In some embodiments, the grooves 920 are partially filled with a first light absorbing material 941 to form the light absorptive regions 940. In another embodiment, the grooves 920 are further filled with an optional second light absorbing material 951 that is different from the first light absorbing material 941, which results in the formation of a meniscus 970 near a top region 921 of the grooves 920. In other embodiments, an optional third light absorbing material 961, which is different from the at least one of the first and the second light absorbing materials 941, 951, can be added above the meniscus 970. In various embodiments, each of the first, second and third light absorbing materials 941, 951, 961 have different colors or absorb light over a different predetermined wavelength range. In some embodiments, a first light absorbing materials can absorb light over one wavelength range, and a second light absorbing material can diffusely scatter light over another wavelength range like a paint.

In other embodiments, a layer of a light absorbing material 980 may be applied on the tops 981 of the light transmissive regions 930, and the grooves 920 may remain unfilled with light absorbing material.

In a second region of the LCF 900, which for clarity is not shown in FIG. 9, a second sub-plurality of light absorptive regions are formed by filling every groove with a single light absorbing material, or no light absorbing material, to form light absorptive regions having a different color than the light absorbing regions 940 in the first sub-plurality 902.

In various embodiments, the grooves 920 can be filled with either white pigmented inks (for example TiO$_2$ or CaCO$_3$) or colored to near the applications final color. When applying pigments to the grooves 920, in some embodiments it can be advantageous to use white pigmented inks because the light absorbing materials usually do not have the optical density to produce ideal colors. If the final application is predominately one color, in some embodiments the first light absorbing material can be the lightest base color, and the second light absorbing material can be a colored ink applied over the base color to adjust the color of the image. Pigmenting with black light absorbing materials makes for a blackout privacy film but pigmenting with any other color gives light that contacts the pigment a second opportunity to scatter (rather than being absorbed) and: 1) increases the chance the light reflects to the bottom of the groove 920 well thereby increasing efficacy of the LCF; and 2) lowers the amount of light absorbed thereby decreasing the temperature of the LCF.

In some embodiments, it may be desirable to print on the surfaces 981 of the light transmissive regions 930 and not in the grooves 920 to form the colorant layer 980 of FIG. 9. In some cases, such as the backlit application for monument and pylon signage, the printing can cover the entire surface of the film.

In some embodiments, at least one of the first, second and third light absorbing materials 941, 951, 961 have a first color at a first temperature in a predetermined temperature range, and a different second color at a different second temperature in the predetermined temperature range. In such an arrangement, the image viewed by the observer can change color as the temperature of the LCF varies over the predetermined temperature range.

Figure 10:
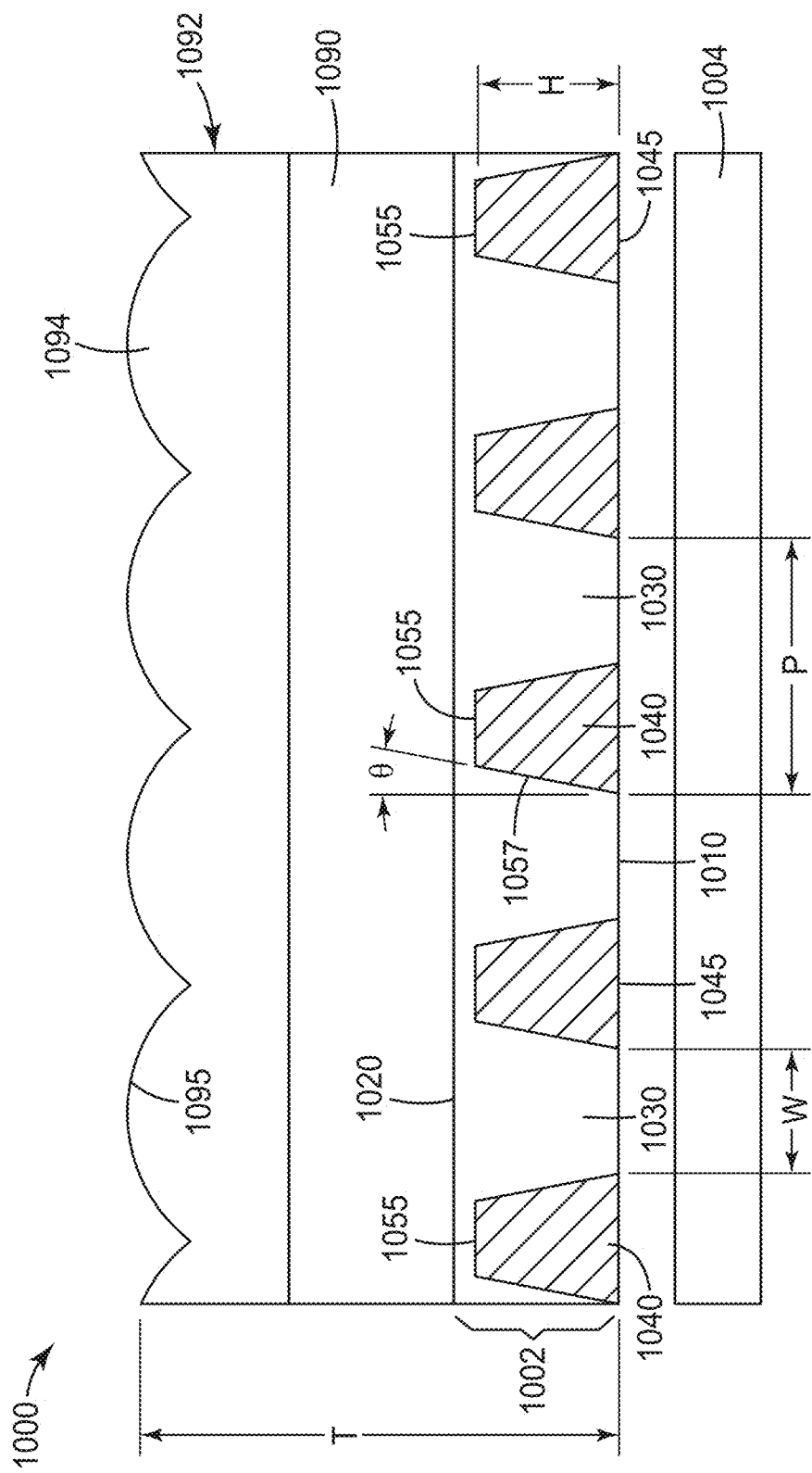
FIG. 10 is a schematic, cross-sectional view of a LCF and a lenticular lens array with contiguous lenses.

Referring now to FIG. 10, an optical article 1000 includes a LCF 1002 with light transmissive regions 1030 and light absorptive regions 1040. The shapes of the light transmissive regions 1030 and the light absorptive regions 1040 can vary widely, and in the embodiment of FIG. 10 the light absorptive regions 1040 are trapezoidal structures with a wide base 1045 at a light input surface 1010 of the LFC 1002 and tapering to a narrower top surface 1055 proximal a light output surface 1020. In various embodiments, the sidewalls 1057 of the light absorptive regions 1040 taper at an angle θ of about 0 degrees to about 6 degrees.

In the embodiment of FIG. 10, the top surfaces 1055 of the light absorbing regions 1040 are recessed from the light output surface 1020, although such a separation is not necessary. In various non-limiting embodiments, the top surfaces 1055 of the light absorptive regions 1040 are recessed from the light output surface 1020 by about 5 μm to about 20 μm.

An optional clear substrate 1090 is on the light output surface 1020 of the LCF 1002. The substrate 1090 can be any clear material, and in some embodiments is a polymeric film such as polycarbonate (PC), polyethylene terephthalate (PET) and the like. In some embodiments, the substrate 1090 can have a refractive index of about 1.5 to about 1.67 or greater.

A linear lenticular lens array 1092 is on the substrate 1090, which includes an arrangement of contiguous optical lenses 1094. In some embodiments, the lens array 1092 is directly on the LCF 1002 such that the light transmissive regions 1030 are integral with the lenses 1094. In some embodiments, as noted above, the lens array 1092 and the LCF 1002 are separated by the substrate 1090.

The lens array 1092, which in some non-limiting embodiments is a structured polymeric film, can have a refractive index of about 1.5 to about 1.67, although it is not necessary that the refractive index of the lens array 1092 match the refractive index of the substrate 1090. In the embodiment of FIG. 10, the lenses 1094 have a substantially constant radius of curvature and can include concave surfaces 1095 facing toward the light output surface 1020 of the LCF 1002. However, in other embodiments not shown in FIG. 10, the lenses 1094 can have convex surfaces to improve light capture for the LCF 1002.

The lenses 1094 can help direct more energy to an underlying device such as a solar cell (not shown in FIG. 10), but in some embodiments the focal length of the lenses 1094 should fill the region below the light absorptive regions 1040 to flood the solar cell. In some embodiments, which are not intended to be limiting, the lenses 1094 have a focal length of about 100 μm to about 200 μm.

In some embodiments, the lenses 1094 can be diffuse, which can provide enhanced light collection from multiple directions.

In some embodiments, the lens array 1092 can optionally be immersed in a medium whose index differs from the surface structure by at least ≥0.1, which can provide a more robust system.

In some embodiments, the light transmissive regions 1030 in the LCF 1002 are substantially aligned with the lenses 1094 in the lens array 1092 such that a focal spot of each lens 1094 is within a corresponding light transmissive region 1030. Lateral alignment of the lenses 1094 to the light transmissive regions 1030 can control the central axis of the light transmitted from the article 1000 between viewing cutoff angle φ. Aligned lenses 1094 and light transmissive regions 1030 result in a normal transmission distribution, but in some embodiments, the lenses 1094 and the light transmissive regions 1030 can be mis-aligned to cause the center of the light transmission distribution from the article 1000 to shift, or to provide other optical effects.

In various embodiments, the thickness T of the article 1000 should be substantially equal to the focal length of the lenses 1094 to create sharp viewing cutoff angle φ. In general, thinner articles 1000 will have higher viewing cutoff angles φ. In various embodiments, higher viewing cutoff angles φ can also be obtained by increasing the pitch P of the light transmissive regions 1030, or by increasing the width W of the apertures in the light transmissive regions 1030.

In addition, the height H of the light absorbing regions 1040 should be selected such that light traversing an adjacent light transmissive regions 1030 does not enter an aperture of a lens 1094 that is not aligned with the light transmissive region. such that the concave portions of the lenses 1094 of the optical lens on each lateral side of the light absorbing region and concave toward the major first surface.

In various embodiments, when the LCF 1002 receives light from a Lambertian light source 1004 through the light input surface 1010, light exits the light control film from the light output surface 1020 having an intensity profile having a substantially flat-top and a half width at half maximum between about 10 degrees to about 20 degrees.

Figure 11:
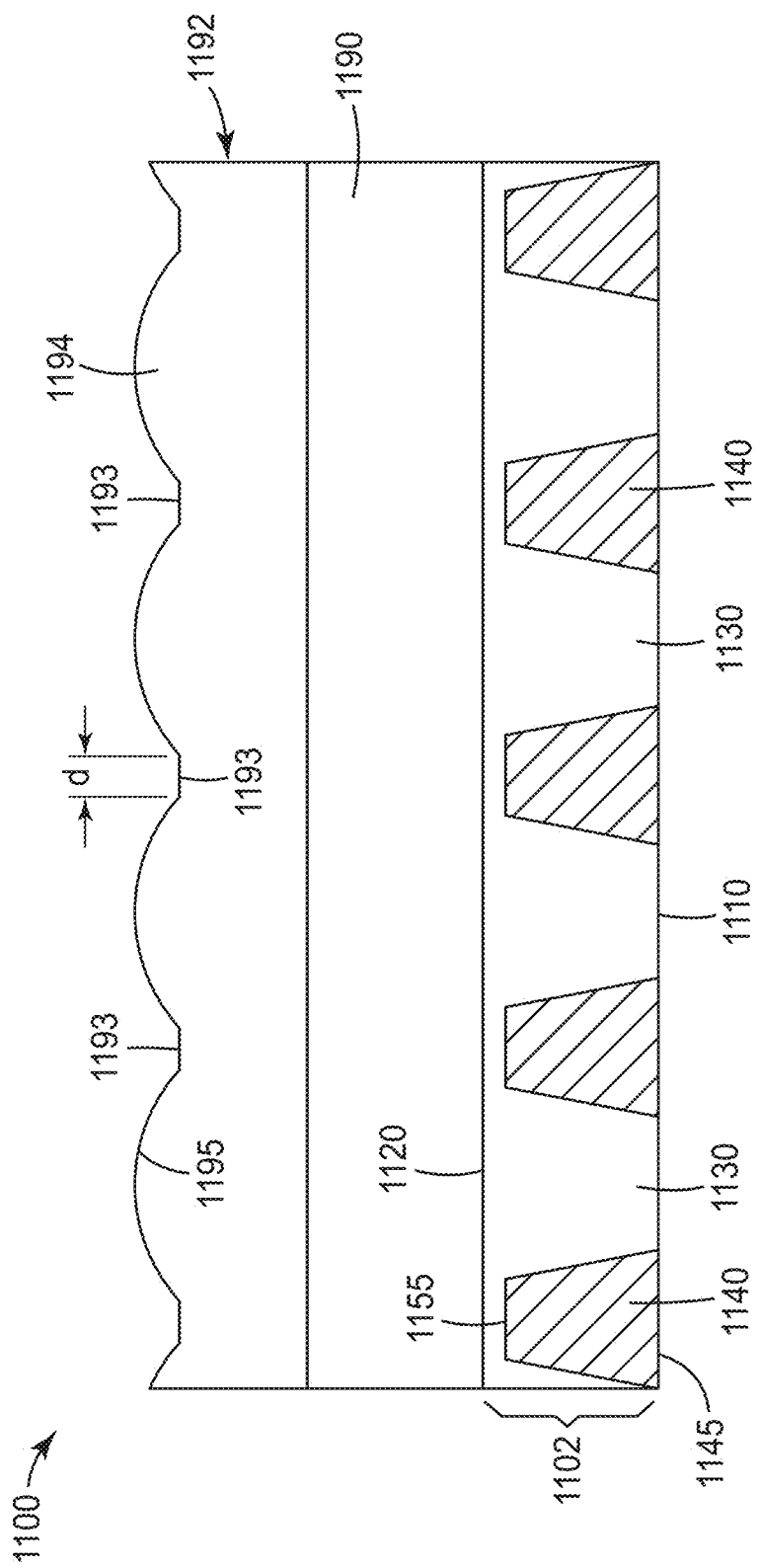
FIG. 11 is a schematic, cross-sectional view of a LCF and a lenticular lens array with non-contiguous lenses.

Referring now to FIG. 11, an optical article 1100 includes a LCF 1102 with light transmissive regions 1130 and light absorptive regions 1140. The light absorptive regions 1140 are trapezoidal structures with a wide base 1145 at a light input surface 1110 of the LFC 1102 and tapering to a narrower top surface 1155 proximal a light output surface 1120.

An optional clear substrate 1190 is on the light output surface 1120 of the LCF 1102. The substrate 1190 can be any clear material, and in some embodiments is a polymeric film such as polycarbonate (PC), polyethylene terephthalate (PET) and the like. In some embodiments, the substrate 1190 can have a refractive index of about 1.5 to about 1.67 or greater.

A linear lenticular lens array 1192 is on the substrate 1190, which includes an arrangement of non-contiguous optical lenses 1194 separated by linear flat region with a length d. The lens array 1192, which in some non-limiting embodiments is a structured polymeric film, can have a refractive index of about 1.5 to about 1.67, although it is not necessary that the refractive index of the lens array 1192 match the refractive index of the substrate 1190. The lenses 1194 have a substantially constant radius of curvature and include concave surfaces 1195 facing toward the light output surface 1120 of the LCF 1102. In some embodiments, which are not intended to be limiting, the lenses 1194 have a focal length of about 100 μm to about 200 μm.

In some embodiments, the light transmissive regions 1130 in the LCF 1102 are substantially aligned with the lenses 1194 in the lens array 1192 such that a focal spot of each lens 1194 is within a corresponding light transmissive region 1130. In various embodiments, to maintain alignment between the lenses 1194 and the light transmissive regions, the ratio of lateral spacing d between the lenses 1194 and a width of the light transmissive regions 1130, d/W, is ≤ about 1.1, or ≤ about 1.0, or ≤ about 0.9, or about ≤0.5.

Figure 12A:
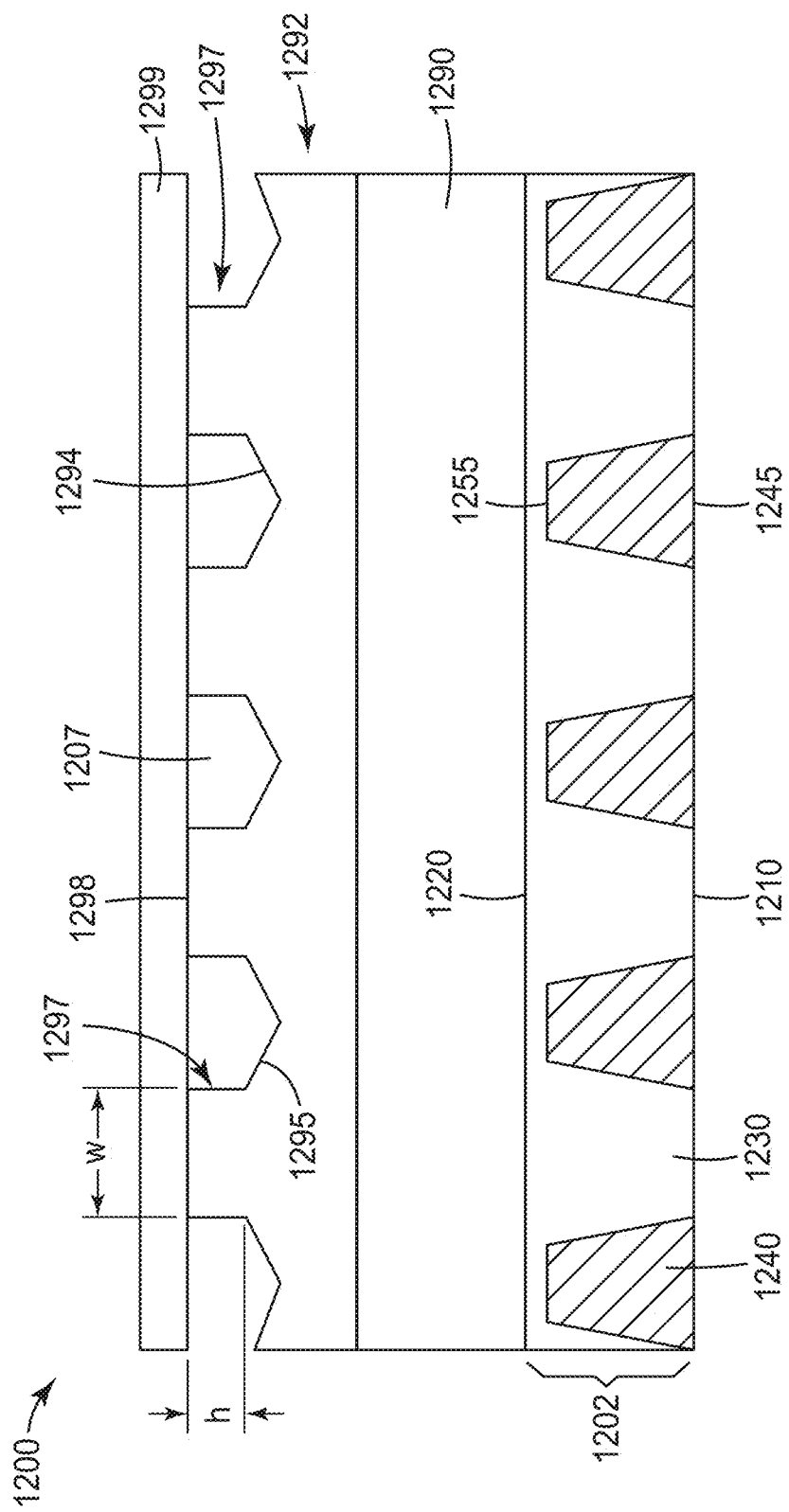
FIG. 12A is a schematic, cross-sectional view of a LCF and a lenticular lens array with attachment portions for bonding the LCF to a substrate.

Referring now to FIG. 12A, an optical article 1200 includes a LCF 1202 with light transmissive regions 1230 and light absorptive regions 1240. The light absorptive regions 1240 are trapezoidal structures with a wide base 1245 at a light input surface 1210 of the LFC 1202 and tapering to a narrower top surface 1255 proximal a light output surface 1220.

An optional clear substrate 1290 is on the light output surface 1220 of the LCF 1202. The substrate 1290 can be any clear material, and in some embodiments is a polymeric film such as polycarbonate (PC), polyethylene terephthalate (PET) and the like. In some embodiments, the substrate 1290 can have a refractive index of about 1.5 to about 1.67 or greater.

A linear lenticular lens array 1292 is on the substrate 1290, which includes an arrangement of non-contiguous optical lenses 1294 separated by linear flat-top lenticular regions 1297. The flat-top lenticular regions 1297 can provide attachment points for laminating or adhesively bonding the article 1200 to a substrate 1299 to form an optical construction. The lenses 1294 have a substantially constant radius of curvature and include concave surfaces 1295 facing toward the light output surface 1220 of the LCF 1102 to focus light toward a corresponding light transmissive region 1230. In some embodiments, which are not intended to be limiting, the lenses 1294 have a focal length of about 100 μm to about 200 μm.

In various embodiments, each lens 1294 and flat-topped lenticular region 1297 can be a unitary construction, or may be formed from separate components. In various embodiments, each unitary lens 1294 has a projected area A and the bonding portion of the lens 1298 has a projected area B, wherein B/A≤0.2. In various embodiments, the flat-topped lenticular regions 1297 have a maximum height h and a maximum width w, wherein h/w≥1, or ≥1.5.

In various embodiments not shown in FIG. 12A, the flat top lenticular regions 1297 can be between the lenses 1294 and above the light absorptive regions 1240, which can minimize the impact on the collection optics. If the lenses 1294 are convex, the cusps may form a bonding portion. If a diffusive film is applied above the LCF 1202, instead of a lens array 1292 (see, for example, FIG. 4A), bonding features can extend from the diffuse surface.

In some embodiments, the light transmissive regions 1230 in the LCF 1202 are substantially aligned with the lenses 1294 in the lens array 1292 such that a focal spot of each lens 1294 is within a corresponding light transmissive region 1230. In some embodiments, the bonding portion 1298 of each unitary lens 1294 is centered relative to the unitary lens, and in some embodiments is located at a peak of the unitary lens 1294.

As noted above, the flat-top lenticular regions 1297 can provide attachment points for laminating or adhesively bonding the article 1200 to a substrate 1299 to form an optical construction. In some embodiments, at least a portion of the bonding portions 1298 of the flat-topped lenticular regions 1297 penetrate the substrate 1299 to form a more permanent bond with the substrate 1299 and maintain alignment of the lenses 1294 and the light transmissive regions 1230. Following the bonding step, a plurality of unfilled voids remains at an interface between the lens array 1292 and the substrate 1299.

In various embodiments, the substrate 1299 can be any type of optical film such as mirror, polarizer, and the like, or a layer of an optical adhesive.

Figure 12B:
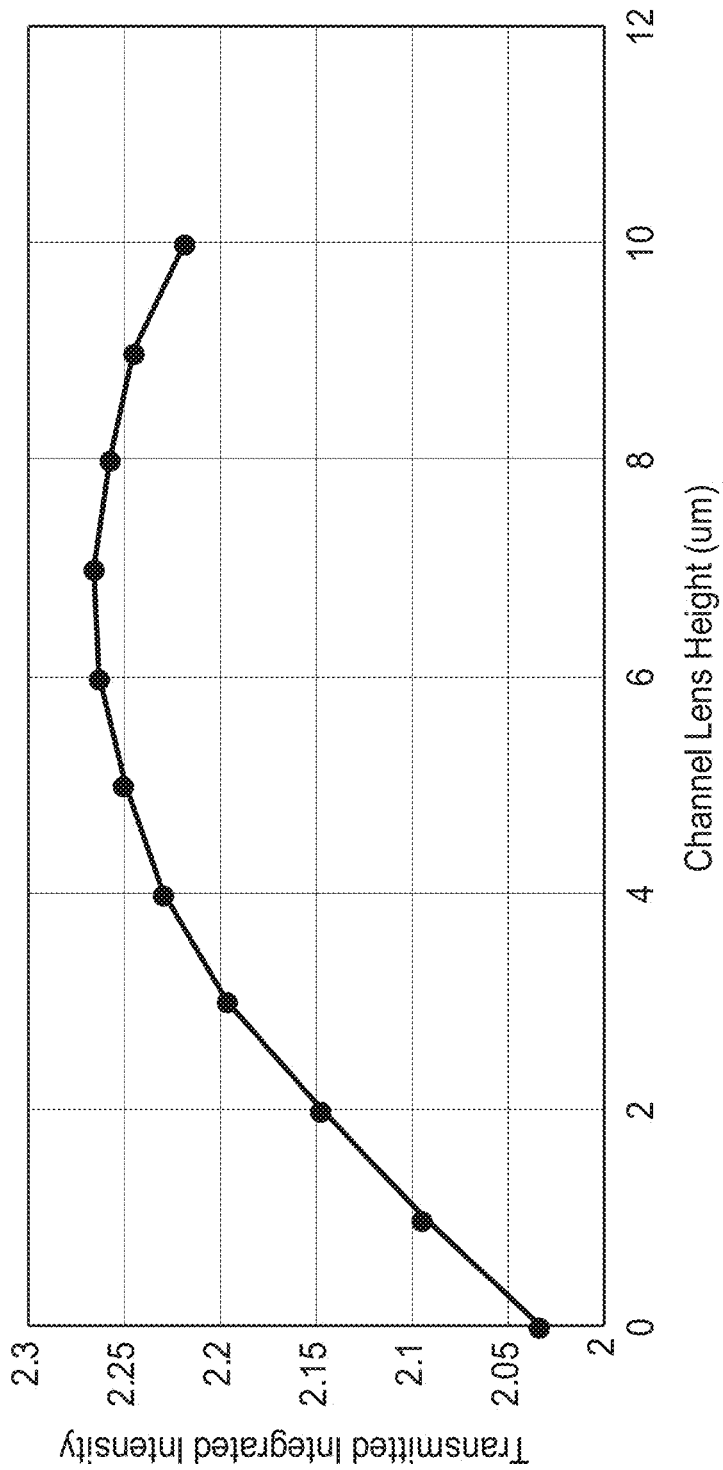
FIG. 12B is a plot of integrated intensity at a surface 1010 of FIG. 12A vs. lenticular lens height for the lenses 1294 of FIG. 12A.
Figure 12C:
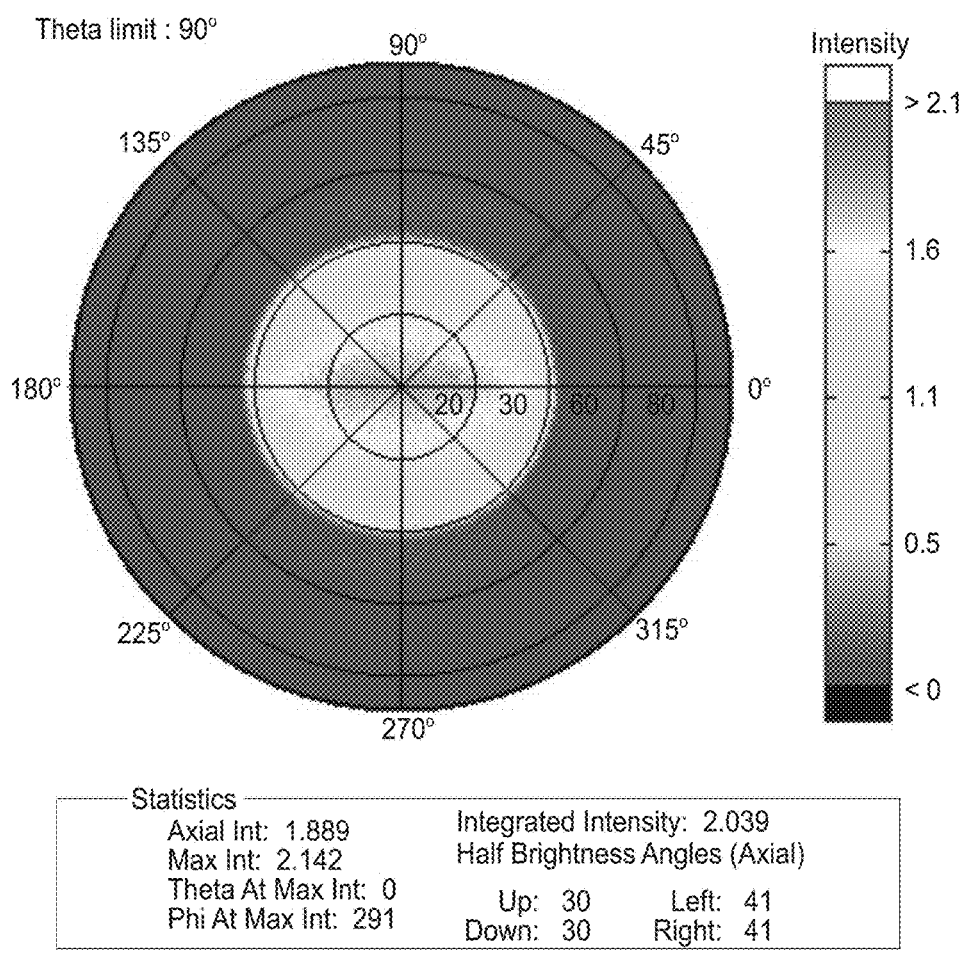
FIG. 12C is a plot of the range of angles incident on a surface 1010 of FIG. 12A without the lens array 1292.
Figure 12D:
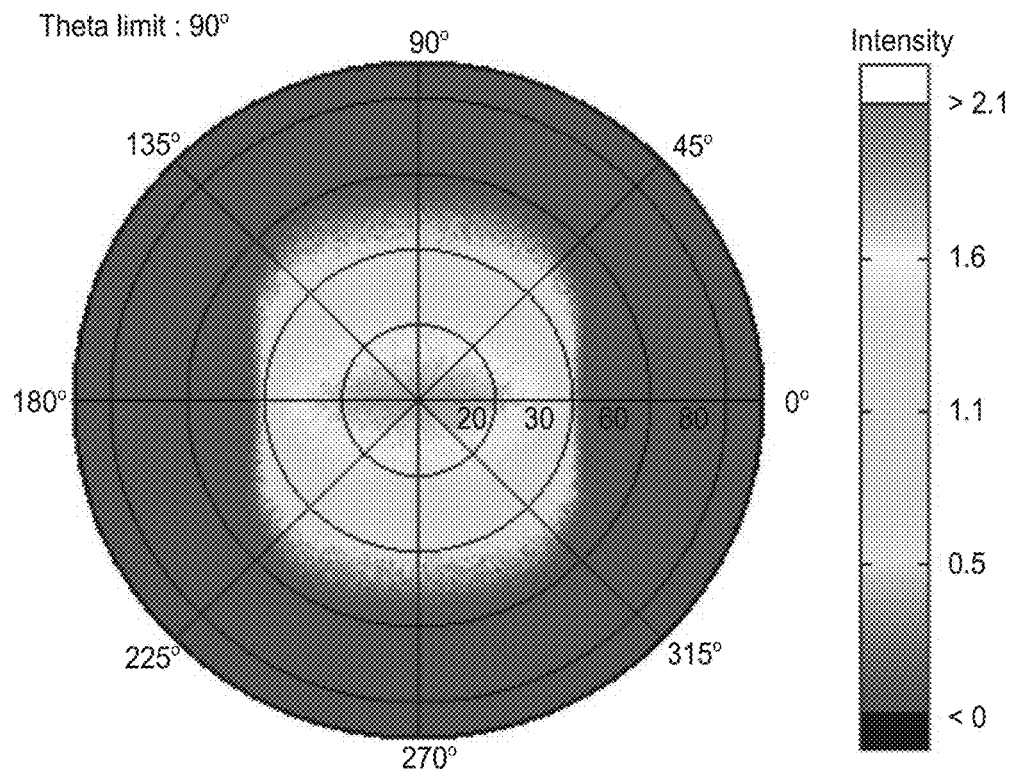
FIG. 12D is plot of the range of light input angles with the highest integrated intensity for the embodiment of FIG. 12A.

FIG. 12B is a plot of integrated intensity at the surface 1010 of FIG. 12A, assuming Lambertian input to the surface 1020 vs. lenticular lens height (related to focal length). FIG. 12C is a plot of the range of angles incident on the surface 1010 without the lens array 1092 of FIG. 12A, while FIG. 12D is plot of the range of angles with the highest integrated intensity (assuming the light absorptive regions 1040 and the lenses 1094 are oriented normal to the surfaces 1010, 1020.

Figure 12E:
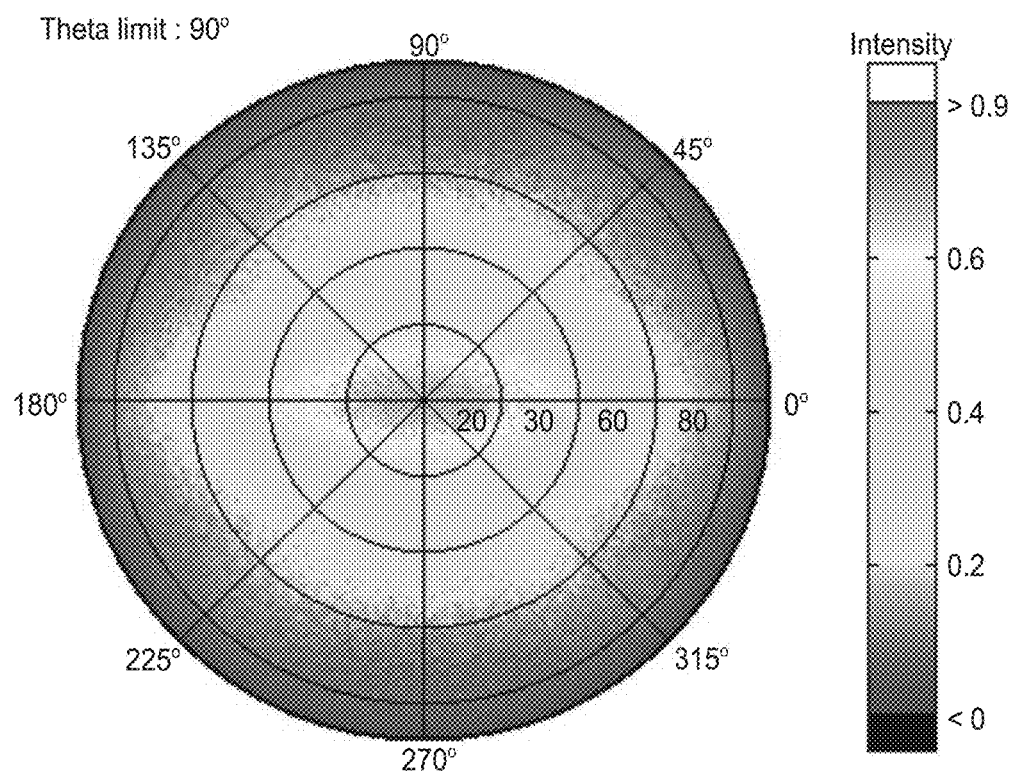
FIG. 12E is a plot of the reflected light from a Lambertian sky without the lens array 1292 of FIG. 12A.
Figure 12F:
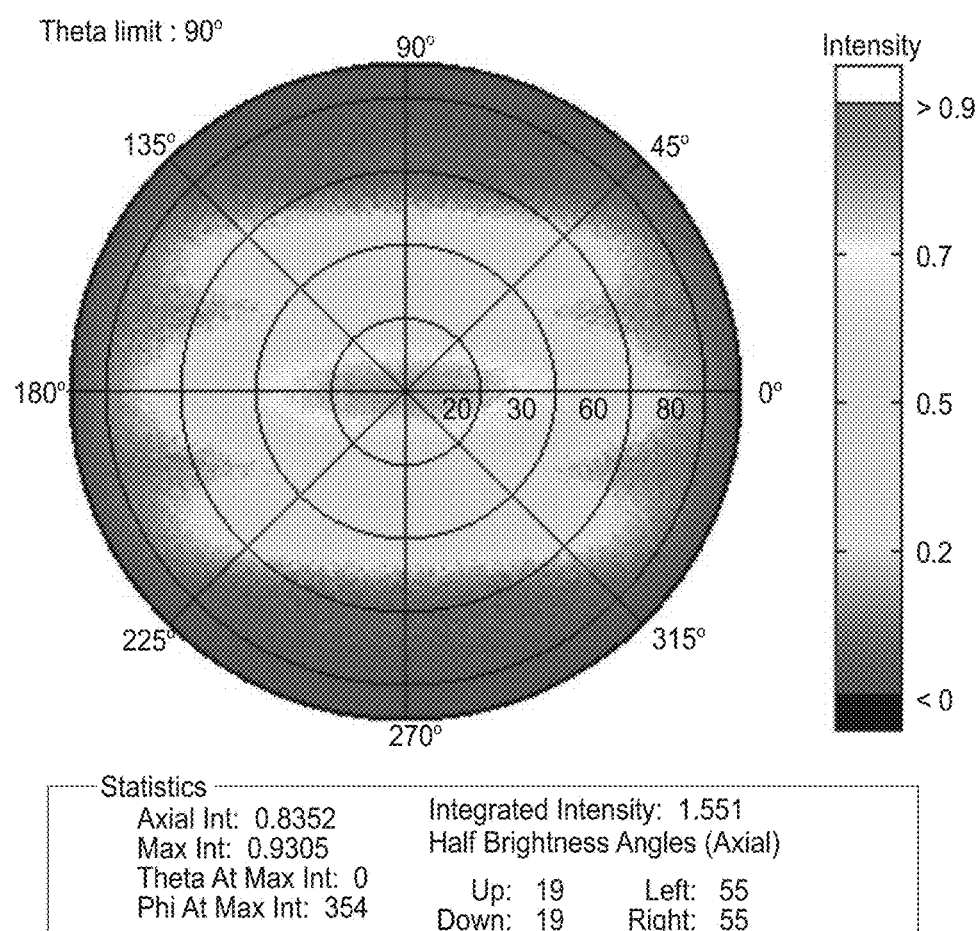
FIG. 12F is a plot of the reflected light from a Lambertian sky with the lens array 1292 of FIG. 12A.

FIG. 12E is a plot of the reflected light from a Lambertian sky without the lens array 1092, while FIG. 12F includes the lens array 1092. As shown in FIG. 12F, the lens array 1092 can improve the stray light outside of the cutoff angle provided by the light absorptive regions 1240.

Figure 12G:
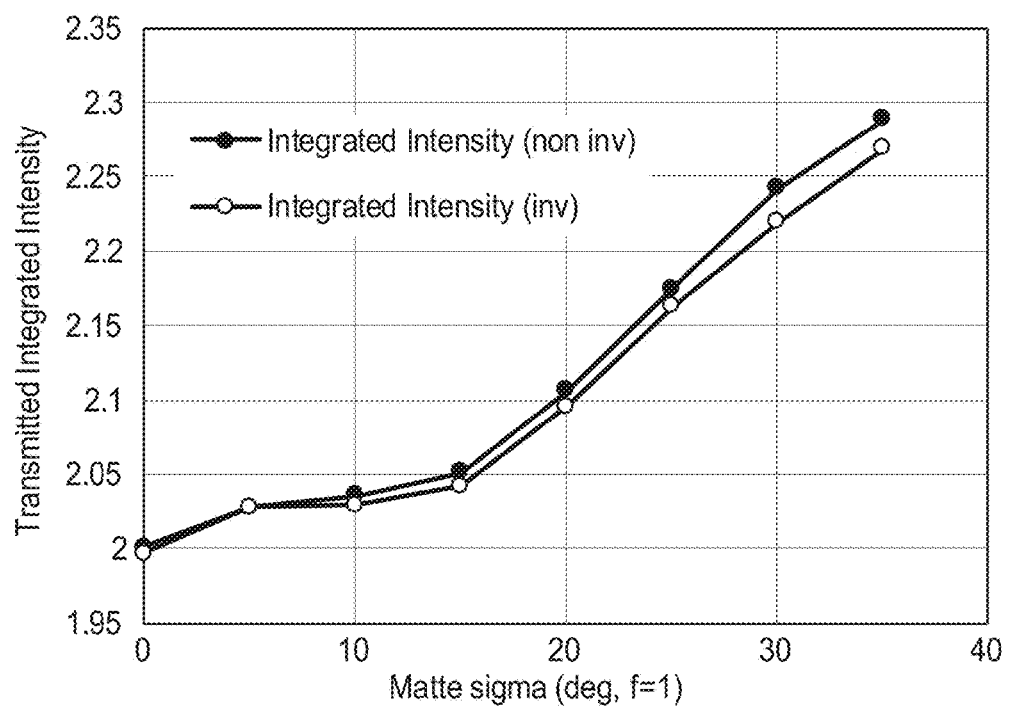
FIG. 12G is a plot of matte sigma vs. integrated intensity at the surface 1010 of FIG. 12A with a top diffuser replacing the lens array 1292.

Referring to FIG. 12G, replacing the lens array 1092 with a top diffuser can increase the collection efficiency at the surface 1010 of FIG. 12A as the haze level is increased (two orientations of the light absorptive regions 1240 were compared, taper up vs down). The highest value exceeded that of the lenticulars.

Figure 12H:
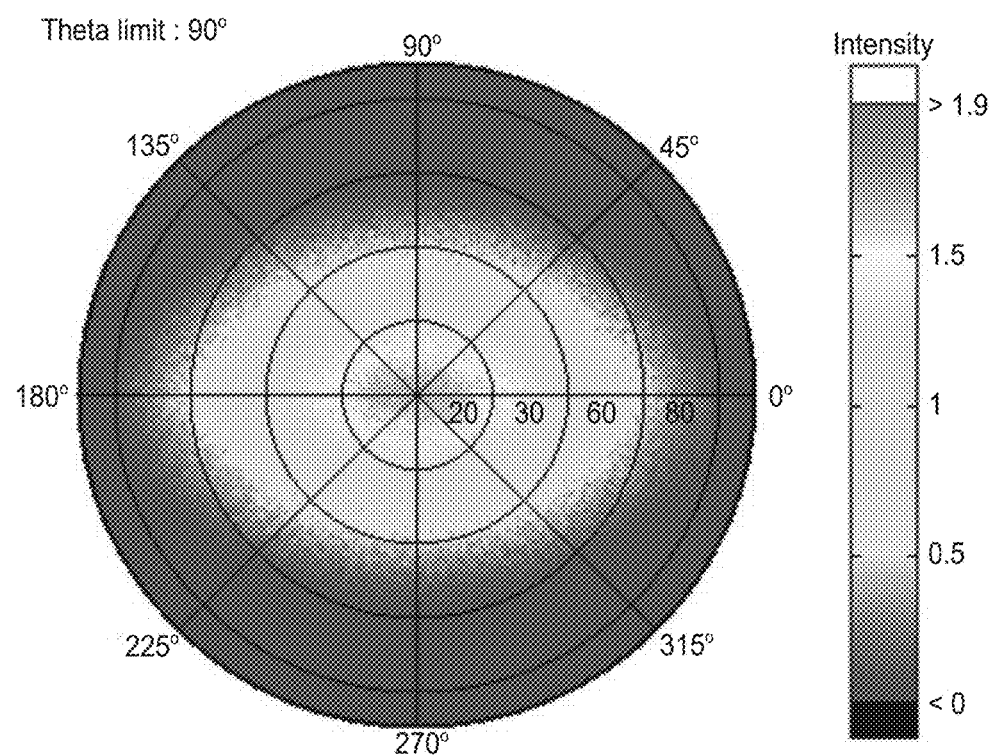
FIG. 12H is a plot of the incident angles along and across the light absorptive regions 1240 of FIG. 12A with a top diffuser replacing the lens array 1292.
Figure 12I:
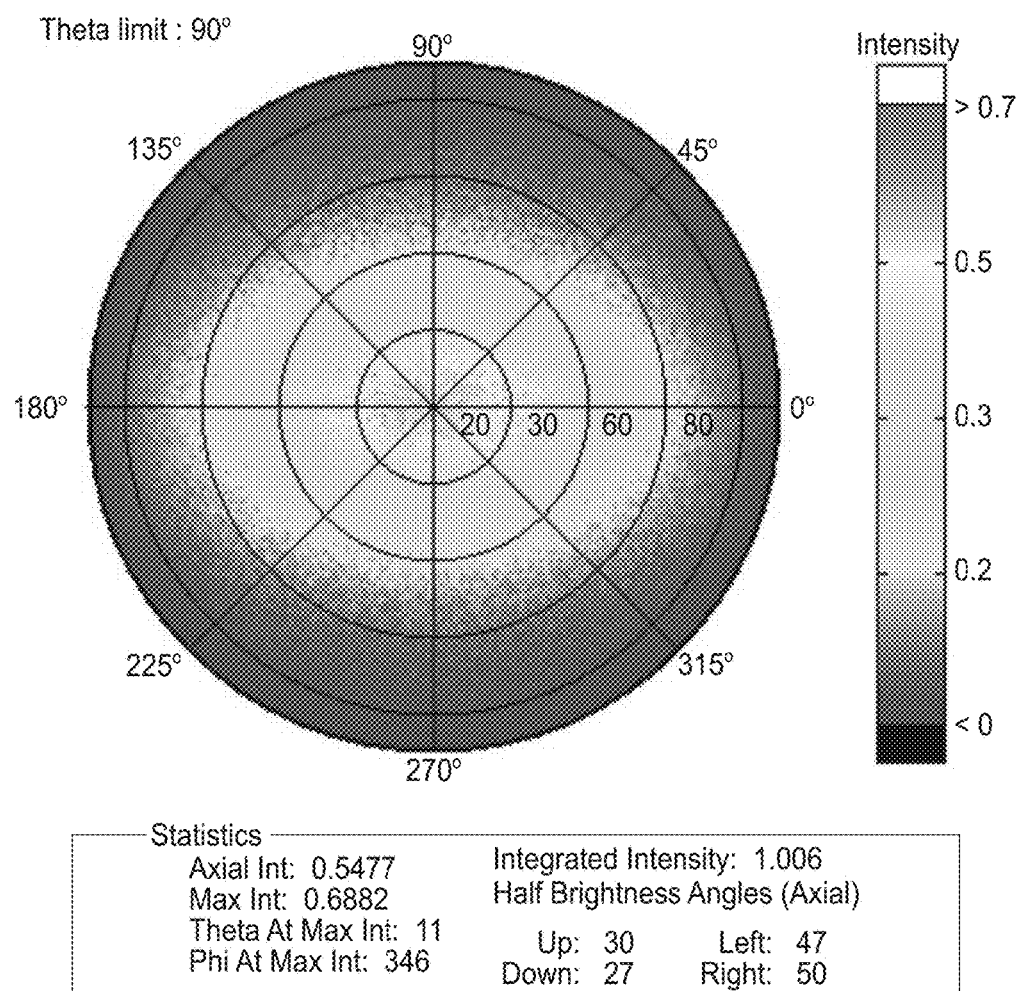
FIG. 12I is a plot of the reflected light from a Lambertian sky at the maximum diffuser haze for a top diffuser replacing the lens array 1292.

The confocal plot of FIG. 12H shows that the surface 1010 sees an expanded range of incident angles along the light absorptive regions 1240 of FIG. 12A, as well as across (still limited by the cutoff angle of the light absorptive regions 1240). The plot of FIG. 12I shows the reflected light from a Lambertian sky at the maximum diffuser haze. FIG. 12I appears to show a less abrupt cutoff angle visible across the light absorptive regions 1240 of FIG. 12A than with the lens array 1292 present, but also less off axis light, suggesting that a device such as a solar cell underlying the LCF 1202 would be less apparent to a viewer with a diffuser surface, with more collected light at the surface 1010.

Figure 13:
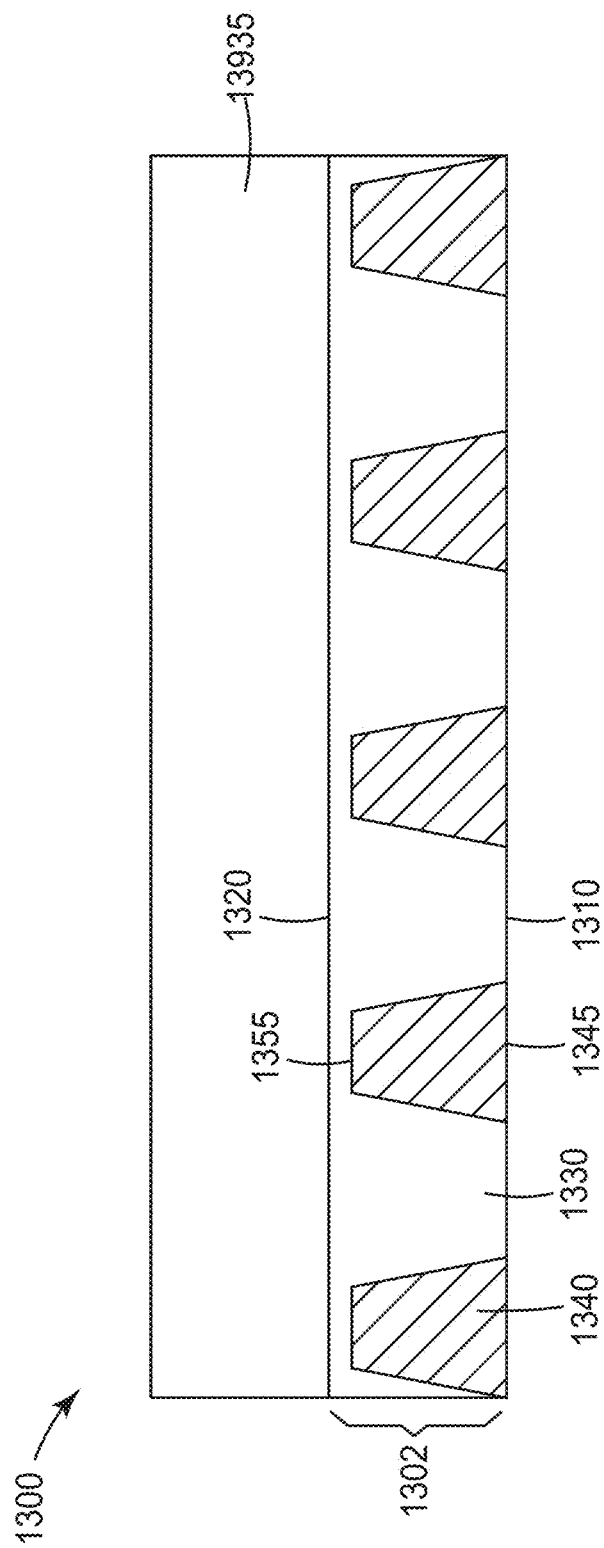
FIG. 13 is a schematic, cross-sectional view of a LCF and a multilayer optical film (MOF).

Referring now to FIG. 13, an optical article 1300 includes a LCF 1302 with light transmissive regions 1330 and light absorptive regions 1340. The light absorptive regions 1340 are trapezoidal structures with a wide base 1345 at a light input surface 1310 of the LFC 1302 and tapering to a narrower top surface 1355 proximal a light output surface 1320.

Each first light absorptive region 1340 substantially absorbs light in a first predetermined wavelength range and substantially transmits light in a nonoverlapping second predetermined wavelength range. A multilayer optical film (MOF) 1355 is on the light output surface 1320 of the LCF 1302.

In some embodiments, the MOF functions as an optical filter for the LCF 1302, and substantially transmits light in the first predetermined wavelength rage and substantially reflects light in a nonoverlapping third predetermined wavelength range, the third predetermined wavelength range partially overlaps the second predetermined wavelength range. In various embodiments, which are not intended to be limiting, the first predetermined wavelength range is from about 400 nm to about 700 nm, the second predetermined wavelength range is from about 750 nm to about 1600 nm, and the third predetermined wavelength range is from about 1200 nm to a wavelength greater than about 1600 nm.

In some embodiments, the MOF provides a visible window and infrared (IR) reflector above the LCF 1302, which also transmits some of the IR (750-1200 nm) and absorbs light in the visible wavelength range, which can prevent excessive heating of the LCF 1302.

Figure 20:
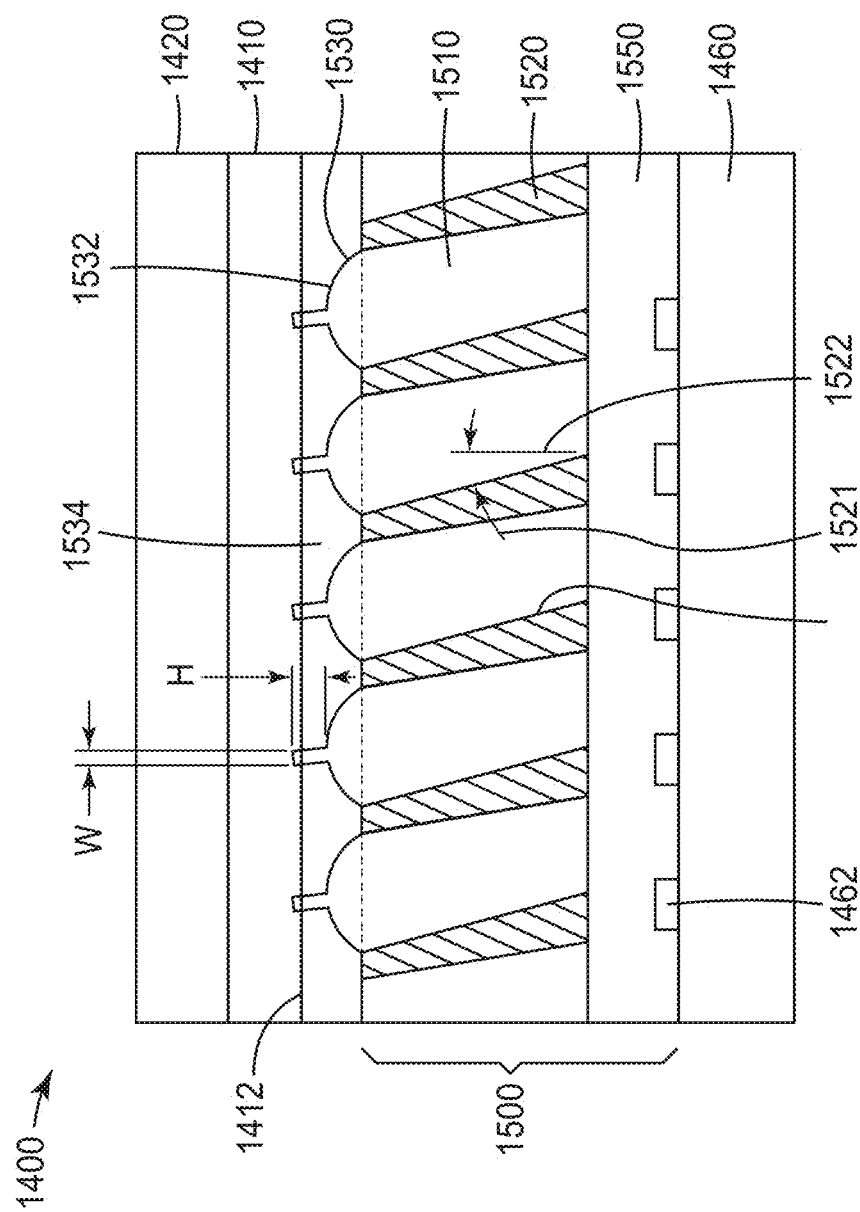
FIG. 20 is a cross-sectional view of a LCF and an optical construction.

FIG. 20 is a schematic of an LCF 1500 that includes alternating light absorbing 1520 and light transmissive 1510 regions and a plurality of unitary lenses 1530. Each unitary lens 1530 is disposed on and aligned with a different light transmissive region and includes a light focusing portion 1532 primarily for focusing light toward the light transmissive region that corresponds to the lens, and a bonding portion 1534 primarily for bonding the lens to a surface 1412. Each optical lens 1530 is a unitary structure meaning that the light focusing and light bonding portions of the lens are integral to one another. Unitary optical lenses 1530 assist in confining light incident on the LCF to the light transmissive regions and away from the light absorbing regions and, as such, improve the overall optical transmission of the LCF. In some cases, each unitary lens 1530 and its corresponding light transmissive region 1510 form a unitary construction, meaning that, for example, no discernable interface exists between the two. In some cases, in a plan view, each unitary lens has a projected area A and the bonding portion of the lens has a projected area B, where B/A≤0.5, or ≤0.4, or ≤0.3, or ≤0.2, or ≤0.1. In some cases, for each unitary lens 1530, the bonding portion of the lens has a maximum height H and a maximum width W, where H/W≥1, or ≥1.2, or ≥1.3, or ≥1.4, or ≥1.5, or ≥1.6, or ≥1.7, or ≥1.8, or ≥1.9, or ≥2. In some cases, in a plan view, such as in a top plan view, the bonding portion of each unitary lens 1530 is substantially centered relative to the unitary lens. In some cases, the bonding portion of each unitary lens 1530 is located substantially at a peak of the unitary lens. In some cases, each light absorbing region 1520 forms an oblique angle 1521 with a line 1522 normal to a plane of the LCF, where in some cases, angle 1521 is from about 5 degrees to about 70 degrees, or about 5 degrees to about 60 degrees, or about 5 degrees to about 50 degrees, or about 10 degrees to about 40 degrees. In some cases, the alternating light absorbing and light transmissive regions 1520 and 1510 are disposed on a light transmissive substrate 1550. In some cases, the light absorbing regions 1520 have a lower index of refraction $n_1$ and the light transmissive regions 1510 have a higher index of refraction $n_2$, where the difference between $n_2$ and $n_1$ may be at least 0.05, or at least 0.06, or at least 0.07, or at least 0.08, or at least 0.09, or at least 0.1, or at least 0.11, or at least 0.12, or at least 0.13, or at least 0.14, or at least 0.15. As a result, light incident on an interface 1523 between adjacent light absorbing region 1520 and light transmissive region 1520 may undergo total internal reflection if the incident angle is greater than the critical angle. In some cases, light incident on the light control film 1500 is transmitted by the light control film, at least in part, by total internal reflection.

FIG. 20 further illustrates an optical construction 1400 that includes an optical film 1410 disposed on the light control film 1500, wherein at least portions of the bonding portions 1534 of at least some of the unitary lenses 1530 penetrate the optical film, which may result in the LCF being bonded to the optical film 1410. In some cases, the optical construction 1400 defines a plurality of unfilled voids 1430 between the light control film and the optical film, where the voids may be filled by, for example, air. In such cases, the primary function of the bonding portions 1534 is to facilitate bonding to the optical film 1410, although, in some cases, they may also have a secondary function, such as assisting in redirecting or scattering light. Furthermore, the primary function of light focusing portions is to focus light incident on the LCF in the light transmission regions 1510 away from the light absorbing regions 1520, although, in some case, such as when portions of at least some of the light focusing portions penetrate the optical film 1410, they may also have the secondary function of assisting in providing bonding between the LCF and the optical film 1410. In some cases, the optical film is or includes an optical adhesive layer. In some cases, the optical construction 1400 further includes an optical element 1420 disposed on the optical film 1410, where the optical element may include one or more of a cover layer, an optical diffuser, an optical filter, and a light redirecting layer.

FIG. 20 also illustrates an optical construction that includes the light control film 1500 disposed on a solar cell 1460. In some cases, the solar cell includes a plurality of electrodes 1462, where at least one light absorbing region 1520 is substantially coextensive and aligned with at least one electrode 1462. In some cases, the light absorbing regions 1520 and the plurality of electrodes 1462 are arranged relative to one another so that the light absorbing regions substantially prevent light incident on the optical construction 1400 from reaching the electrodes.

In some cases, optical film 1410 may be an optical diffuser disposed on LCF 1500 or any other LCF disclosed herein. An optical diffuser 1410 assist in scattering light incident on the LCF, especially at high incident angle, into the light transmissive regions 1410 and toward solar cell 1460.

In some cases, optical film 1410 may display information to a viewer viewing the optical construction 1400 from an oblique viewing angle, such as a viewing angle greater than about 30 degrees, or greater than about 40 degrees, or greater than about 50 degrees, or greater than about 60 degrees, or greater than about 70 degrees. The displayed information may be one or more of a text message, a word, a letter, a name, an icon, a logo, a symbol, a sign, a trademark, a brand, a sign, an alphanumeric, a picture, an image and an indicium. For example, in some cases, the optical construction 1400 or any other optical construction or LCF disclosed herein, may be disposed in an environment displaying an image to a viewer. In such cases, optical film 1410 may display substantially the same image to effectively camouflage the optical construction or the LCF.

In some cases, a light control film disclosed herein having alternating light absorbing and light transmissive regions, further includes a first image, such as image 980, formed thereon for viewing by a viewer. In some cases, the first image is formed on both the light absorbing and light transmissive regions. In some cases, the first image is formed on the light transmissive, but not the light absorbing, regions. In some cases, the first image is printed, for example, ink jet printed. In some cases, the first image is a camouflaging image or pattern for camouflaging the light control film or any optical device, such as a display or a solar cell, disposed on the light control film. In some cases, the light control film is disposed on or adjacent a background environment, such as a roof of a building, displaying a second image where the second image may be the image or pattern of the siding material of the roof. In such cases, the first image may substantially match the second image thereby substantially camouflaging the light control film.

EXAMPLES

Example 1

A solvent ink was coated on to a LCF with a 0.5 mil (12 µm) gapped gauge block and cured in an oven at 150° F. (66° C.) oven for 10 minutes. A series of multiple colors of solvent screen print inks were coated, including press ready (diluted) inks available from 3M Company under the trade designations solvent screen printing inks 1905 and 2915. A concentrated ink available from 3M under the trade designation 3M 1903 was also coated on to LCF.

Figure 14A:
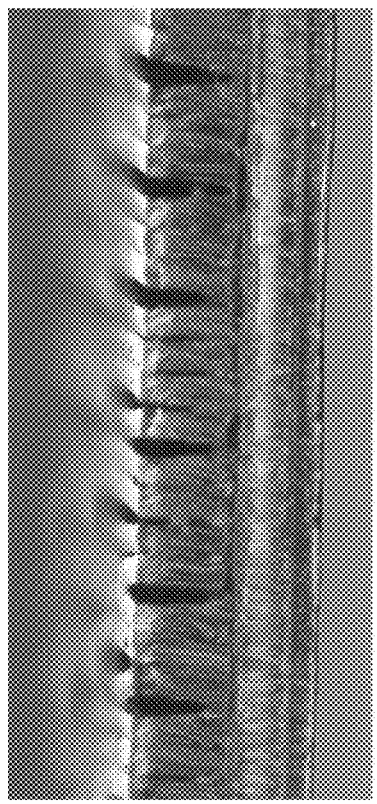
FIG. 14A is a cross-sectional view of a solvent ink coated LCF of Example 1.
Figure 14B:
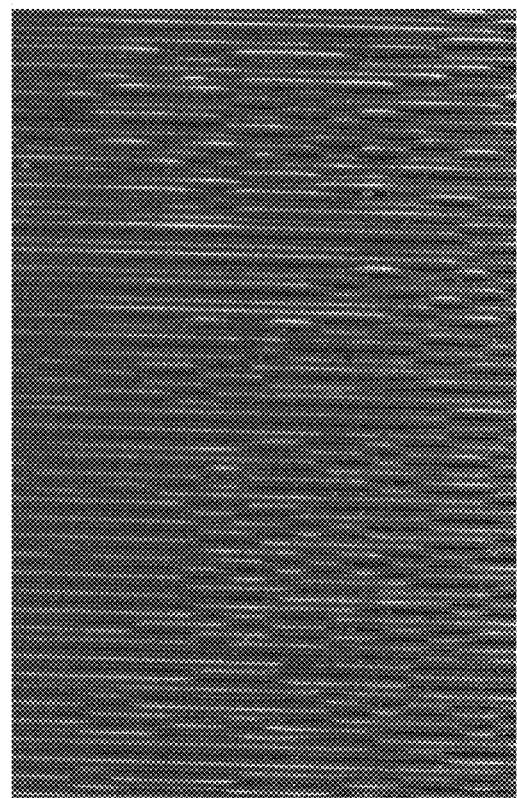
FIG. 14B is an overhead view of the solvent ink coated LCF of Example 1.
Figure 14C:
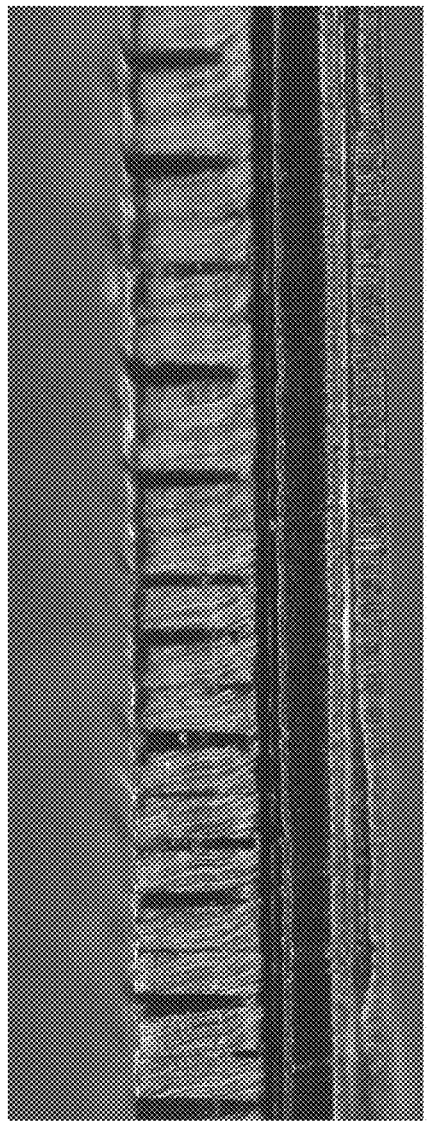
FIG. 14C is a cross-sectional view of a solvent ink coated LCF of Example 1.
Figure 14D:
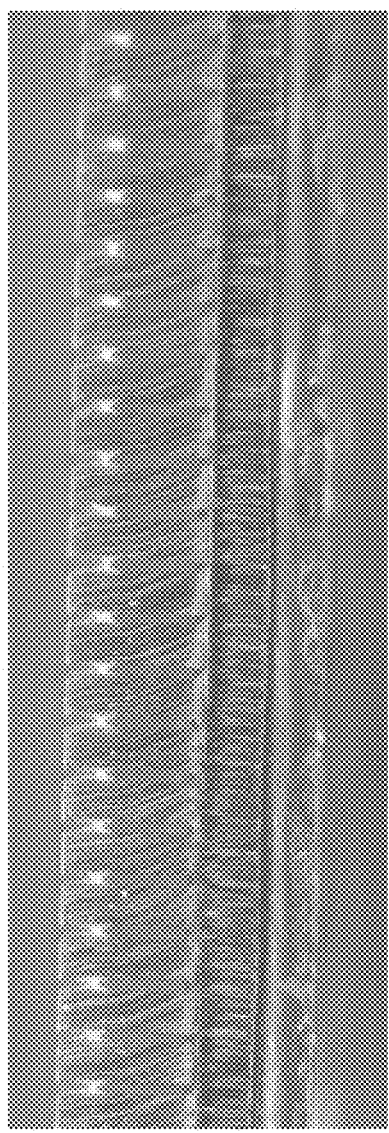
FIG. 14D is a cross-sectional view of a solvent ink coated LCF of Example 1.

As shown in FIGS. 14A-14C, the diluted inks, which have a high concentration of solvent, appear to distort the LCF structure, but the diluted inks fill the channels in the LCF structure more completely. The concentrated ink prior to dilution is less likely to fill the channels in the LCF structure (FIG. 14C). In the coated LCFs of FIGS. 14A-14C, a parallax cut-off effect was not obvious, but the coated LCFs have mild to moderate cut-off. The samples appeared mostly translucent or opaque.

Example 2

A solvent ink available from Seiko Epson Corp., Long Beach, Calif., under the trade designation Ultra Chrome GS3 was ink jet printed onto a LCF film using an Epson printer Sure Color S80600. Color bars and blocks of cyan, magenta, yellow and black were printed in combination to make red, green, and blue colored regions on the LCF. Color test blocks were printed with 100% ink density.

Figure 15:
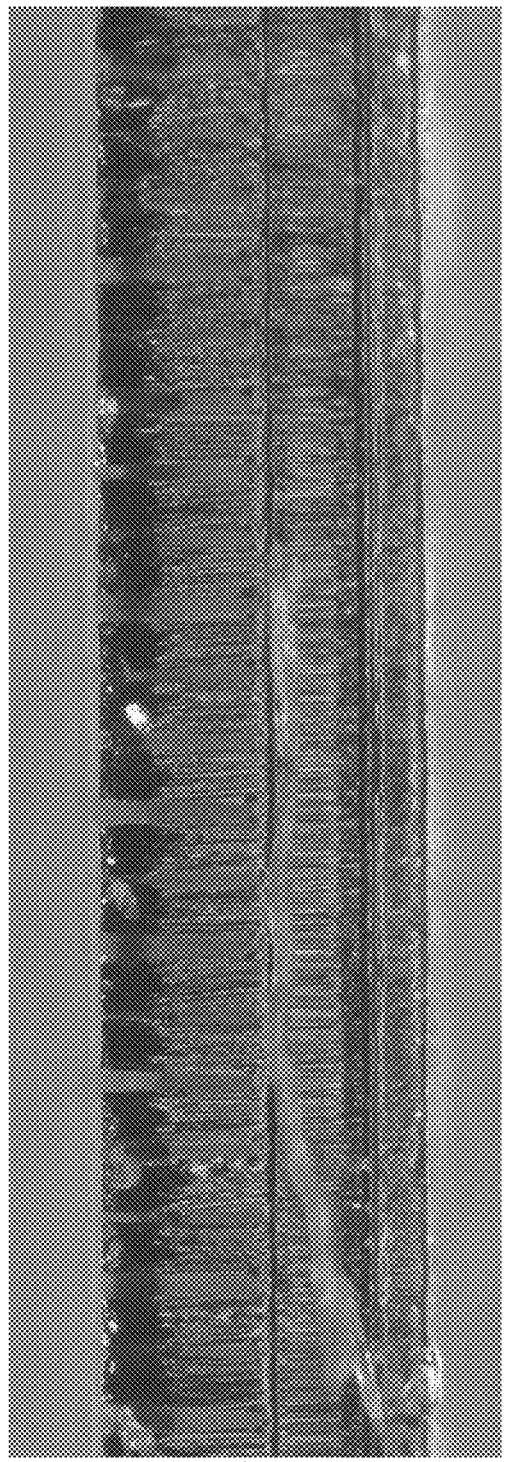
FIG. 15 is a cross-sectional view of an ink jet printed LCF of Example 2.

A parallax cut-off effect was not observed, and the samples appeared mostly translucent or colored transparent. The image of FIG. 15 shows a 100% cyan ink laydown in which the ink penetrated the channel, but in most cases did not leave a substantial amount of residue in the grooves. A spray coating of ink on a LCF could be used for a dual image concept.

Example 3

An ultraviolet (UV) curable ink available from 3M under the trade designation SuperFlex was ink jet printed at 600 dots per inch (dpi) onto a LCF using a printer available from EFI, Fremont, Calif., under the trade designation Vutek GS3250LXr. The ink had layers of magenta over white. Percent laydown of magenta ink ranged from 0-100% printed on 100% laydown of white ink, which created a multilayer magenta structure over white ink.

A parallax cut-off effect was not observed, and samples appeared mostly translucent, which could have been due to lack of optical density. The optical density could be improved with a higher $TiO_2$ loading, more ink laydown, or increased penetration of the grooves in the LCF.

Figure 16A:
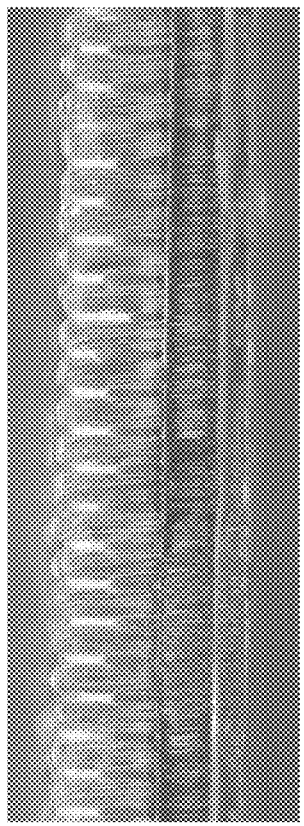
FIG. 16A is a cross-sectional view of a UV curable ink jet printed LCF of Example 3.
Figure 16B:
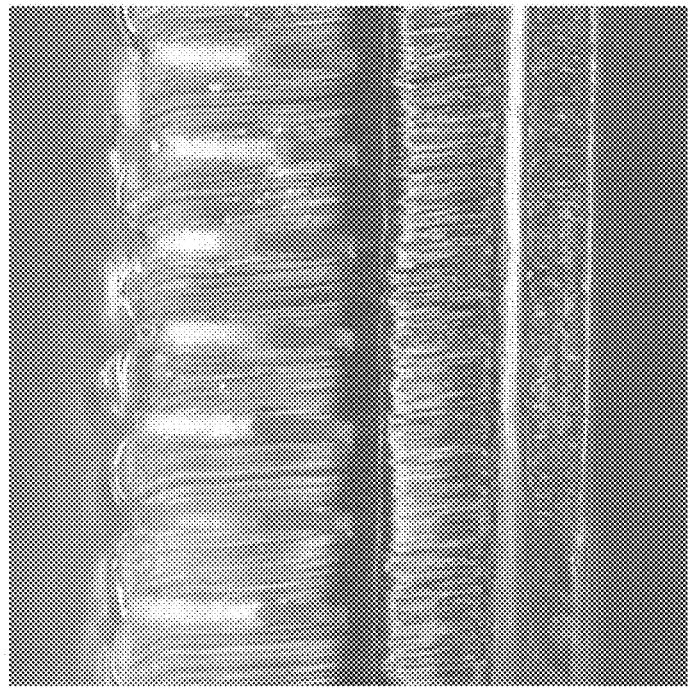
FIG. 16B is a cross-sectional view of a UV curable ink jet printed LCF of Example 3.
Figure 16C:
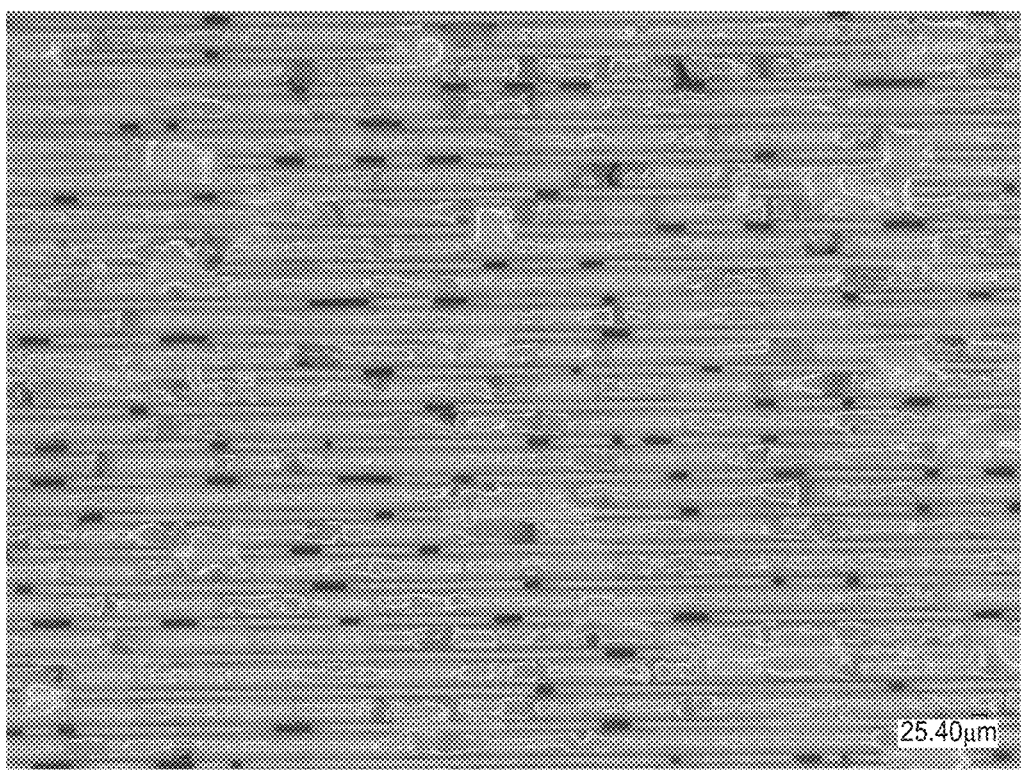
FIG. 16C is an overhead view of the UV curable ink coated LCF of Example 3.

The coated LCFs are shown in FIGS. 16A-16C, which indicate that the grooves are about 50% or less penetrated and there was not 100% ink coverage. Increasing dot density to 1000 dpi should increase overage, and suspect ink appeared to be cured and frozen in place before it had time to migrate down to the grooves to form the light absorptive regions.

Example 4

A UV curable ink available from 3M under the trade designation Superflex UV ink TB-22780, white, was manually Meyer bar coated and notch bar coated onto a LCF. The ink had a viscosity of 20-30 cps at 25° C. The ink was cured using a UV processor at approximately 250 joules total exposure. The Meyer Rod was a KCC Bar No. 0/0.00015" (4 µm) Wet Film Deposit/0.002" (0.05 mm) size wire. The notch bar gap was set to 0 (no gap).

Parallax cut-off was observed from the object. The coating methods left residue on the top of the channels of the LCF that could be scratched off to show the image of the object below without the color overlay of the ink. Multiple scrapers were used that had a durable but no metal edge, such as a rigid plastic squeegee, to remove excess ink.

Figure 17A:
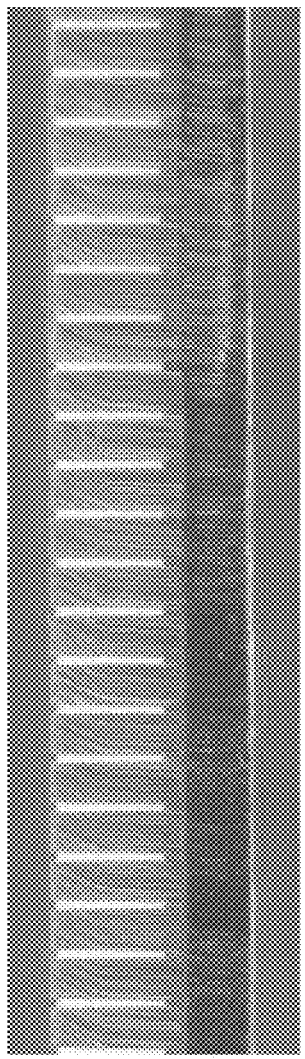
FIG. 17A is a cross-sectional view of a UV curable ink Meyer rod coated LCF of Example 4.
Figure 17B:
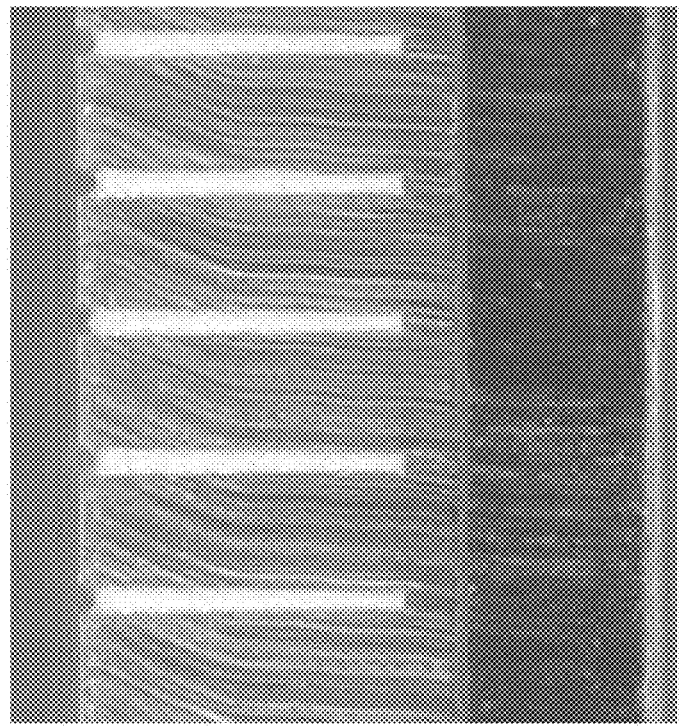
FIG. 17B is a cross-sectional view of a UV curable ink jet Meyer rod coated LCF of Example 4.
Figure 17C:
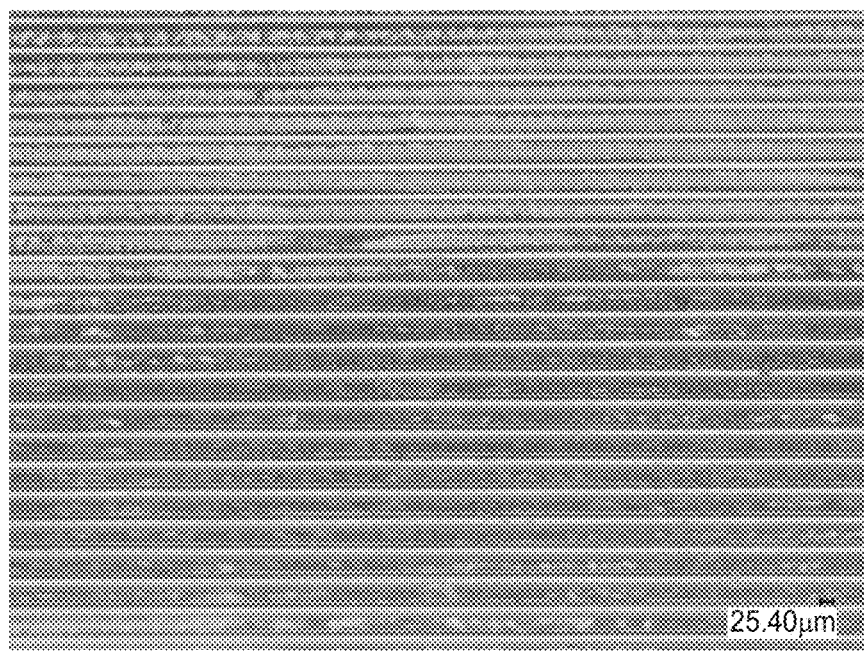
FIG. 17C is an overhead view of the UV curable ink Meyer rod coated LCF of Example 4.
Figure 17D:
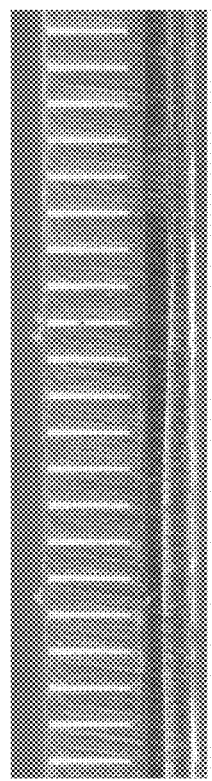
FIG. 17D is a cross-sectional view of a scraped UV curable ink jet Meyer rod coated LCF of Example 4.
Figure 17E:
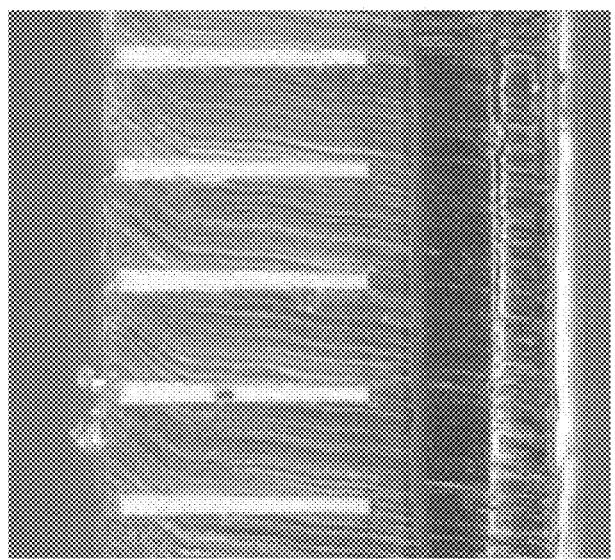
FIG. 17E is a cross-sectional view of a scraped UV curable ink jet Meyer rod coated LCF of Example 4.

The images in FIGS. 17A-C show a nearly filled louvers of white ink. In FIGS. 17D-E, the ink was scraped off the top of the channels, which improved the visibility of the object below without compromising the cut off. This effect was clearly demonstrated with white and magenta ink, and the effect was more pronounced when the channels were spaced at about 10 mm or greater.

Example 5

A UV curable ink available from 3M under the trade designation Superflex UV ink TB-22780, white, was manually Meyer bar coated and notch bar coated onto a LCF. The ink had a viscosity of 20-30 cps at 25° C. The ink was cured using a UV processor at approximately 250 joules total exposure. The Meyer Rod was a KCC Bar No. 0/0.00015" (4 μm) Wet Film Deposit/0.002" (0.05 mm) size wire. The notch bar gap was set to 0 (no gap). Afterwards, a magenta ink (TB-22791) was coated via a second pass with the Meyer rod on top of the previously coated white ink.

A parallax cut-off effect was clearly demonstrated, and as with the white UV ink of Example 4 the effect was more pronounced when the channels in the LCF film were spaced at about 10 mm or greater from the object. The coating method left residue on the top of the channel that could be scratched off to show the image of the object below without the color overlay of the ink.

Figure 18A:
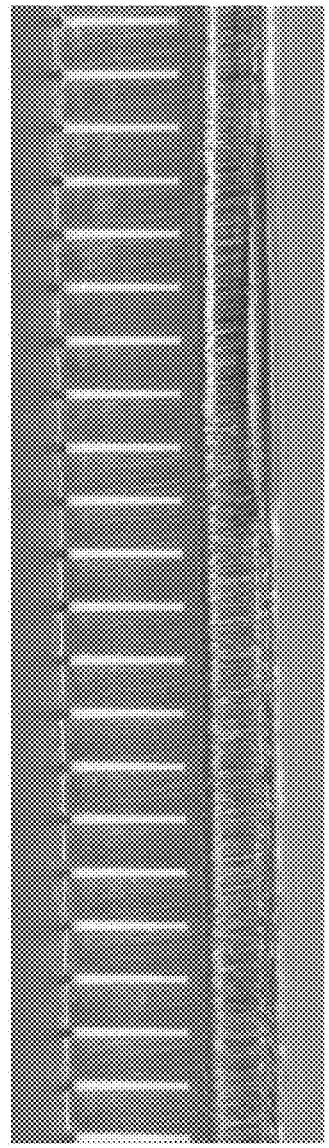
FIG. 18A is a cross-sectional view of a UV curable ink jet Meyer rod coated LCF of Example 5 with layered colors.
Figure 18B:
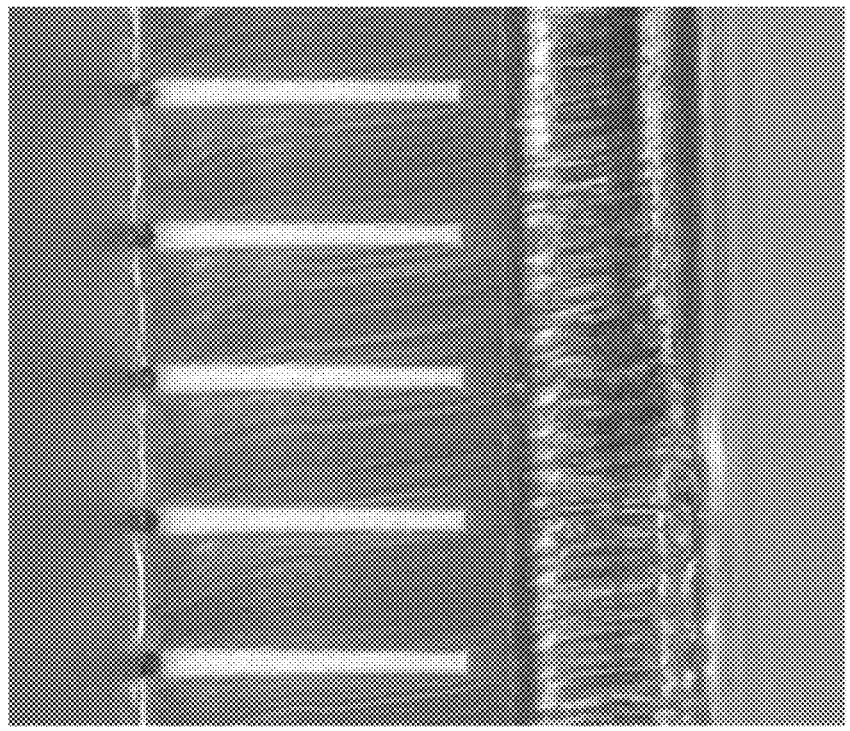
FIG. 18B is a cross-sectional view of a UV curable ink jet Meyer rod coated LCF of Example 5 with layered colors.

The images of FIGS. 18A-B show a nearly filled louvers of white 9800 series inks with the magenta UV Ink added to the top.

Figure 18C:
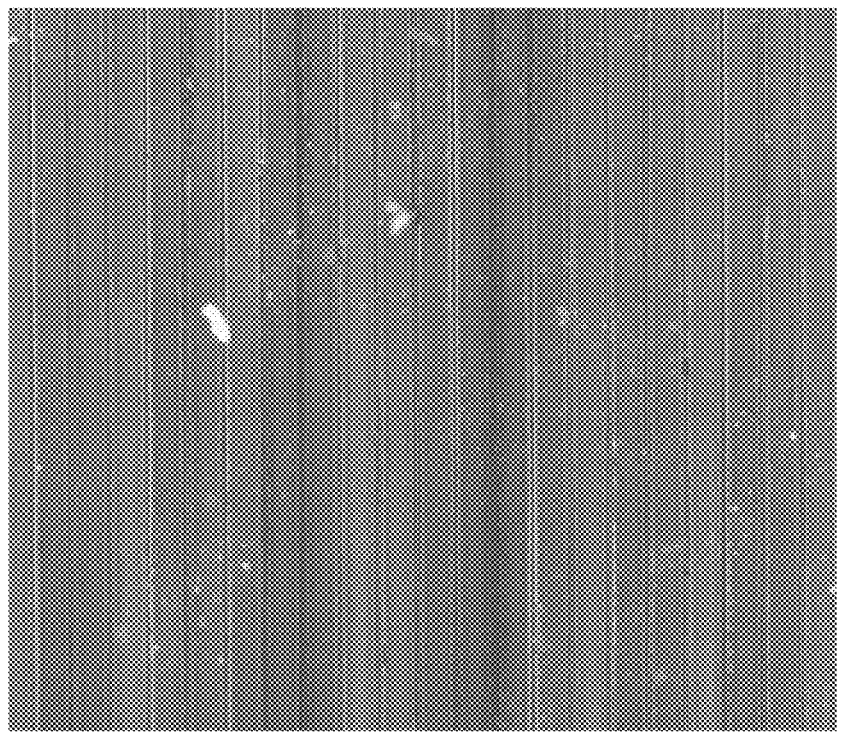
FIG. 18C is an overhead view of a UV curable ink jet Meyer rod coated LCF of Example 5 with layered colors.
Figure 18D:
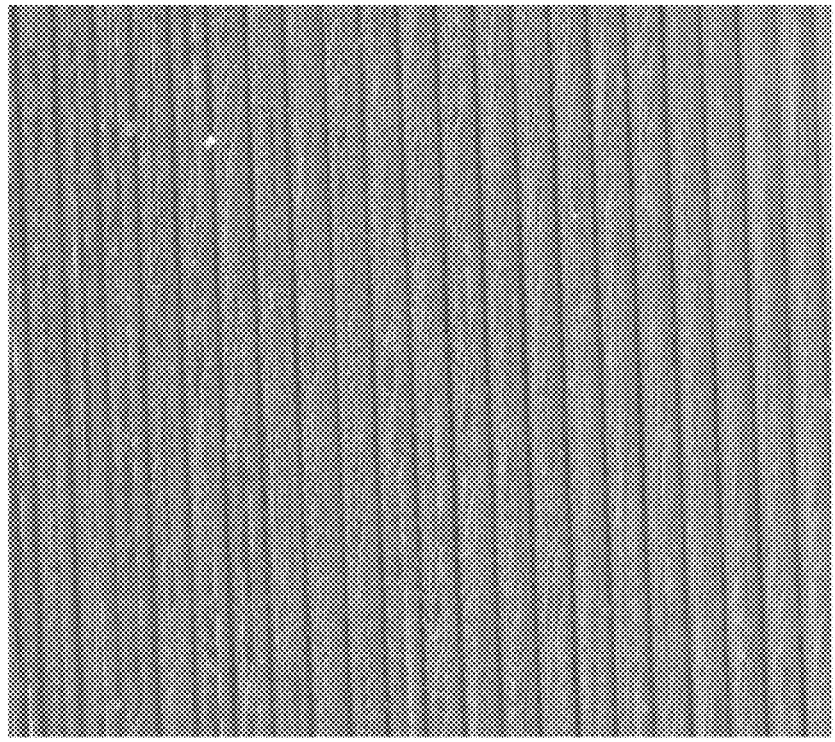
FIG. 18D is an overhead view of a scraped UV curable ink jet Meyer rod coated LCF of Example 5 with layered colors.
Figure 18E:
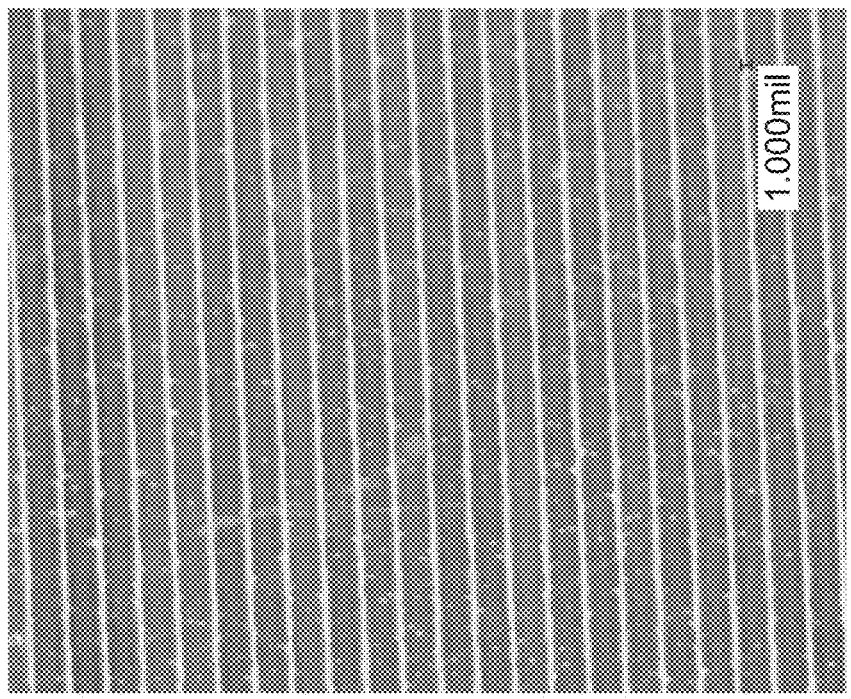
FIG. 18E is a bottom view of a UV curable ink jet Meyer rod coated LCF of Example 5 with layered colors.
Figure 18F:
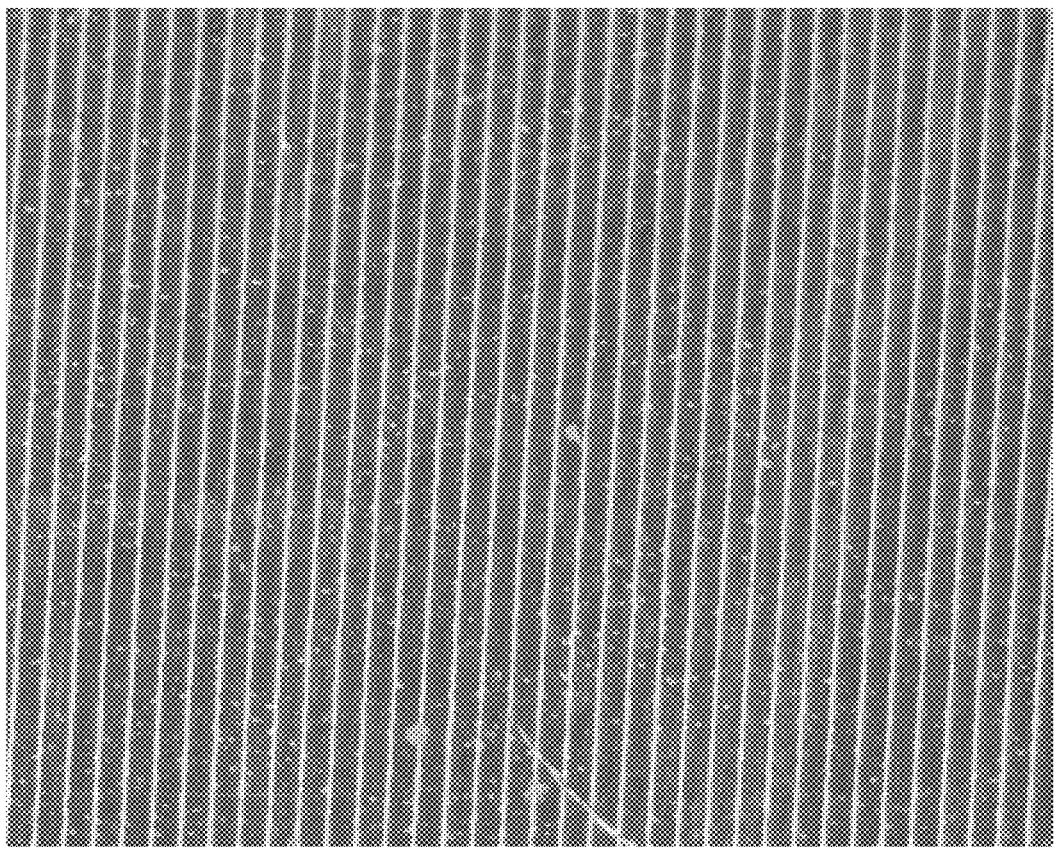
FIG. 18F is a bottom view of a scraped UV curable ink jet Meyer rod coated LCF of Example 5 with layered colors.
Figure 19A:
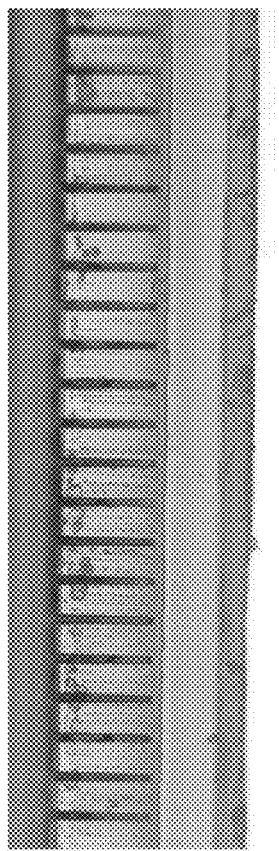
FIG. 19A is a cross-sectional view of a latex ink jet printed LCF of Example 6.
Figure 19B:
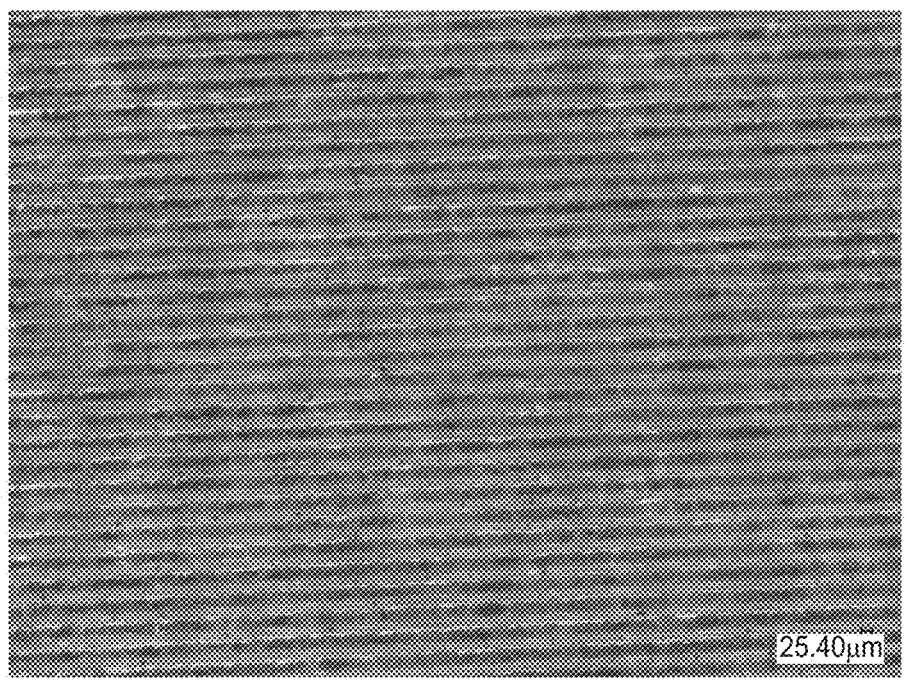
FIG. 19B is an overhead view of the latex ink jet printed LCF of Example 6 showing a slate-like stone pattern.

Referring to FIG. 18C, when the magenta UV Ink was coated over white ink the sample appeared magenta. As shown in FIG. 18D, the magenta Ink could clearly be seen in the grooves when looking at the samples from the top down into the grove. As shown in FIG. 18E, when observing the sample backwards or bottom up only white ink could be seen in the groves, however the sample that was not scrapped clean had a magenta hue due to residual ink on the top of the channel. As shown in FIG. 18F, the samples that were scrapped clean had a little magenta ink in the grove but didn't look as vibrantly magenta as the sample prior to scrapping. More pigment or dyed ink is necessary during printing or coating to get the desired color saturation. This could be done by half filling the grove with white ink prior to coating with pigmented inks.

Example 6

A latex ink available from Hewlett Packard under the trade designation HP 831 was ink jet printed onto a LCF using a HP latex printer model Latex 360 printer. An image of a stone was printed in full color (CMYK).

A parallax cut-off effect was observed. Most of the ink landed on the surface of the film creating the image of the slate stone. As with the solvent based ink, the latex ink penetrated the surface of the channel and dried to very low volume while not fully filling the grooves. This image could also be printed over white filled grooves, which may create a more distinct image.

EMBODIMENTS

Embodiment 1

A light control film comprising a plurality of spaced apart substantially parallel first light absorbing regions arranged along a first direction, each first light absorbing region having a width and a height, the plurality of first light absorbing regions comprising nonoverlapping first and second sub-pluralities of the plurality of first light absorbing regions, the first sub-plurality of the plurality of first light absorbing regions having a first viewing angle, the second sub-plurality of the plurality of first light absorbing regions having a different second viewing angle.

Embodiment 2

The light control film of embodiment 1, wherein each of the first and second sub-pluralities includes at least 100 first light absorbing regions.

Embodiment 3

The light control film of embodiments 1 or 2, wherein the first light absorbing regions are substantially perpendicular to a major surface of the light control film.

Embodiment 4

The light control film of any of embodiments 1 to 3, wherein the first light absorbing regions form oblique angles with a major surface of the light control film.

Embodiment 5

A solar cell assembly comprising the light control film of any of embodiments 1 to 4 disposed on a solar cell.

Embodiment 6

A light control film comprising a plurality of spaced apart substantially parallel first light absorbing regions disposed between major first and second surfaces of the light control film, each first light absorbing region having a width W, a height H and a length L, $H/W \geq 1$, $L/H \geq 20$, such that for an image displayed through the light control film, the image having sequential first, second and third image portions, a same characteristic of the image portions changes less for the first and third image portions and more for the second image portion when moving from viewing the image at a first viewing angle to viewing the image at a different second viewing angle.

Embodiment 7

The light control film of embodiment 6, wherein the characteristic is color.

Embodiment 8

The light control film of embodiments 6 or 7, wherein the characteristic is brightness.

Embodiment 9

The light control film of claim any of embodiments 6 to 8, wherein the first light absorbing regions are substantially perpendicular to the major first and second surfaces of the light control film.

Embodiment 10

A light control film comprising a plurality of spaced apart substantially parallel first light absorbing regions disposed between major first and second surfaces of the light control film, each first light absorbing region having a width W, a height H and a length L, H/W≥1, L/H≥20, each first light absorbing region comprising a multilayer stacked in the thickness direction of the first light absorbing region, the multilayer comprising a first layer substantially absorbing light in a first predetermined wavelength range and substantially transmitting light in a different second predetermined wavelength range, and a second layer disposed on the first layer and substantially absorbing light in the second predetermined wavelength range and substantially transmitting light in the first predetermined wavelength range.

Embodiment 11

The light control film of embodiment 10, wherein the first light absorbing regions are at least partially embedded in an optical medium substantially transmitting light in the first and second predetermined wavelength ranges.

Embodiment 12

The light control film of embodiments 10 or 11, wherein the optical medium comprises a higher index of refraction and each of the first and second layers comprises a lower index of refraction.

Embodiment 13

The light control film of any of embodiments 10 to 12, wherein a minimum difference between the higher and lower indices of refraction is 0.1.

Embodiment 14

The light control film of any of embodiments 10 to 13, wherein the second layers of the first light absorbing regions form a text message, a word, a letter, a name, an icon, a logo, a symbol, a sign, a trademark, a brand, a sign, an alphanumeric, a picture, an image and an indicium.

Embodiment 15

A light control film comprising a plurality of spaced apart substantially parallel first light absorbing regions disposed between major first and second surfaces of the light control film, each first light absorbing region having a width W, a height H and a length L, H/W≥1, L/H≥20, at least one first light absorbing region substantially absorbing light in a first predetermined wavelength range and substantially transmitting light in a different second predetermined wavelength range, and at least one other first light absorbing region substantially absorbing light in the second predetermined wavelength range and substantially transmitting light in the first predetermined wavelength range.

Embodiment 16

A light control film comprising a plurality of spaced apart substantially parallel first light absorbing regions disposed between major first and second surfaces of the light control film, each first light absorbing region having a width W, a height H and a length L, H/W≥1, L/H≥20, at least for one first light absorbing region, the first light absorbing region having a first color at a first temperature in a predetermined temperature range and a different second color at a different second temperature in the predetermined temperature range.

Embodiment 17

A light control film comprising alternating light absorbing and light transmissive regions disposed between, and substantially perpendicular to, substantially parallel opposing major first and second surfaces, each light absorbing region tapering from a wider first end proximate the major first surface to a narrower second end proximate the major second surface, each light transmissive region terminating at, and aligned with, a corresponding optical lens at the major first surface, the first end of each light absorbing region recessed relative to a base of the optical lens on each lateral side of the light absorbing region and concave toward the major first surface.

Embodiment 18

The light control of embodiment 17, further comprising a substrate comprising the major second surface and disposed away from the major first surface.

Embodiment 19

The light control film of embodiments 17 or 18, such that when the light control film receives light from a Lambertian light source through the major first surface, light exits the light control film from the major second surface of the light control film having an intensity profile having a substantially flat-top and a half width at half maximum between about 10 degrees to about 20 degrees.

Embodiment 20

The light control film of any of embodiments 17 to 19, wherein each light absorbing region tapers at an angle from about 2 degrees to about 20 degrees.

Embodiment 21

The light control film of any of embodiments 17 to 20, wherein each optical lens has a focal length from about 100 microns to about 200 microns.

Embodiment 22

The light control film of any of embodiments 17 to 21, wherein the first end of each light absorbing region is recessed from the major first surface by a distance from about 5 microns to about 20 microns.

Embodiment 23

The light control film of any of embodiments claims 17 to 22, wherein the optical lenses are integral with the light transmissive regions.

Embodiment 24

An optical construction comprising:
a light control film comprising a plurality of spaced apart first light absorbing regions, each first light absorbing region substantially absorbing light in a first predetermined wavelength range and substantially transmitting light in a non-overlapping second predetermined wavelength range; and
an optical filter disposed on the light control film and substantially transmitting light in the first predetermined wavelength rage and substantially reflecting light in a non-overlapping third predetermined wavelength range, the third predetermined wavelength range partially overlapping the second predetermined wavelength range.

Embodiment 25

The optical construction of embodiment 24, wherein the first light absorbing regions form oblique angles with a plane of the light control film.

Embodiment 26

The optical construction of embodiments 24 or 25, wherein each first light absorbing region absorbs at least 60% of light in the first predetermined wavelength range.

Embodiment 27

The optical construction of any of embodiments 24 to 26, wherein each first light absorbing region absorbs at least 70% of light in the first predetermined wavelength range.

Embodiment 28

The optical construction of any of embodiments 24 to 27, wherein each first light absorbing region absorbs at least 80% of light in the first predetermined wavelength range.

Embodiment 29

The optical construction of any of embodiments 24 to 28, wherein each first light absorbing region transmits at least 60% of light in the second predetermined wavelength range.

Embodiment 30

The optical construction of any of embodiments 24 to 29, wherein each first light absorbing region transmits at least 70% of light in the second predetermined wavelength range.

Embodiment 31

The optical construction of any of embodiments 24 to 30, wherein each first light absorbing region transmits at least 80% of light in the second predetermined wavelength range.

Embodiment 32

The optical construction of any of embodiments 24 to 31, wherein the optical filter transmits at least 60% of light in the first predetermined wavelength range.

Embodiment 33

The optical construction of any of embodiments 24 to 32, wherein the optical filter transmits at least 70% of light in the first predetermined wavelength range.

Embodiment 34

The optical construction of any of embodiments 24 to 33, wherein the optical filter transmits at least 80% of light in the first predetermined wavelength range.

Embodiment 35

The optical construction of any of embodiments 24 to 34, wherein the light control film transmits light, at least in part, by total internal reflection.

Embodiment 36

The optical construction of any of embodiments 24 to 35, wherein at least 5% of light transmitted by the light control film is by total internal reflection.

Embodiment 37

The optical construction of any of embodiments 24 to 36, wherein at least 10% of light transmitted by the light control film is by total internal reflection.

Embodiment 38

The optical construction of any of embodiments 24 to 37, wherein the optical filter transmits and reflects light primarily by optical interference.

Embodiment 39

The optical construction of any of embodiments 24 to 38, wherein the optical filter comprises a plurality of polymeric layers, each polymeric layer transmitting and reflecting light primarily by optical interference, the plurality of polymeric layers having alternating lower and higher indices of refraction.

Embodiment 40

The optical construction of any of embodiments 19 to 23, wherein:
the first predetermined wavelength range is from about 400 nm to about 700 nm;
the second predetermined wavelength range is from about 750 nm to about 1600 nm; and
the third predetermined wavelength range is from about 1200 nm to a wavelength greater than about 1600 nm.

Embodiment 41

The optical construction of embodiment 40, wherein the optical filter substantially reflects light in a fourth predetermined wavelength range nonoverlapping with the first predetermined wavelength range, such that as incidence angle of light incident on the optical construction increases, the optical filter transmits less light in the first predetermined wavelength range and transmits more light in the fourth predetermined wavelength range.

Embodiment 42

The optical construction of embodiments 40 or 41, wherein wavelengths in the fourth predetermined wavelength range are shorter than wavelengths in the first predetermined wavelength range.

Embodiment 43

The optical construction of any of embodiments 40 to 42, wherein the fourth predetermined wavelength range is from about 350 nm to about 420 nm.

Embodiment 44

An optical construction comprising:
a light control film comprising alternating light absorbing and light transmissive regions; and
a lens sheet disposed on the light control film and comprising a plurality of lenses, each lens corresponding to and aligned with a different light transmissive region, a minimum lateral spacing between each pair of sequential light transmissive regions being w, a maximum lateral spacing between the lenses corresponding to the pair of sequential light transmissive regions being d, wherein $d/w \leq 1$.

Embodiment 45

The optical construction of embodiment 44, wherein $d/w \leq 0.9$.

Embodiment 46

The optical construction of embodiments 44 or 45, wherein a focal spot of each lens is located inside the corresponding light transmissive region.

Embodiment 47

A light control film comprising alternating light absorbing and light transmissive regions and a plurality of unitary lenses, each unitary lens disposed on and aligned with a different light transmissive region and comprising:
a light focusing portion primarily for focusing light toward the light transmissive region corresponding to the lens; and
a bonding portion primarily for bonding the lens to a surface.

Embodiment 48

The light control film of embodiment 47, wherein each corresponding unitary lens and light transmissive region form a unitary construction.

Embodiment 49

The light control film of embodiments 47 or 48, wherein in a plan view, each unitary lens has a projected area A and the bonding portion of the lens has a projected area B, $B/A \leq 0.2$.

Embodiment 50

The light control film of any of embodiments 47 to 49, wherein for each lens, the bonding portion of the lens has a maximum height H and a maximum width W, $H/W \geq 1$.

Embodiment 51

The light control film of any of embodiments 47 to 50, wherein for each lens, the bonding portion of the lens has a maximum height H and a maximum width W, $H/W \geq 1.5$.

Embodiment 52

The light control film of any of embodiments 47 to 51, wherein in a plan view, the bonding portion of each unitary lens is centered relative to the unitary lens.

Embodiment 53

The light control film of any of embodiments 47 to 52, wherein the bonding portion of each unitary lens is located at a peak of the unitary lens.

Embodiment 54

The light control film of any of embodiments 47 to 53, wherein each light absorbing region forms an oblique angle with a line normal to a plane of the light control film.

Embodiment 55

The light control film of embodiment 54, wherein the angle is from about 5 degrees to about 50 degrees.

Embodiment 56

The light control film of any of embodiments 47 to 55, wherein the alternating light absorbing and light transmissive regions are disposed on a light transmissive substrate.

Embodiment 57

The light control film of any of embodiments 47 to 56, wherein the light absorbing regions have a lower index of refraction and the light transmissive regions have a higher index of refraction.

Embodiment 58

The light control film of any of embodiments 47 to 57, wherein light incident on the light control film is transmitted by the light control film, at least in part, by total internal reflection.

Embodiment 59

An optical construction comprising the light control film of any of embodiments 47 to 58, and an optical film disposed on the light control film, wherein at least portions of the bonding portions of at least some of the unitary lenses penetrate the optical film.

Embodiment 60

The optical construction of embodiment 59, defining a plurality of unfilled voids between the light control film and the optical film.

Embodiment 61

The optical construction of any of embodiments 59 or 60, wherein the optical film comprises an optical adhesive layer.

Embodiment 62

The optical construction of any of embodiments 59 to 61, further comprising an optical element disposed on the optical film, the optical element comprising one or more of a cover layer, an optical diffuser, an optical filter, and a light redirecting layer.

Embodiment 63

An optical construction comprising the light control film of any of embodiments 47 to 62 disposed on a solar cell.

Embodiment 64

The optical construction of embodiment 63, wherein the solar cell comprises a plurality of electrodes, and wherein at least one light absorbing region is substantially coextensive and aligned with at least one electrode.

Embodiment 65

The optical construction of embodiments 63 or 64, wherein the solar cell comprises a plurality of electrodes, and wherein the light absorbing regions and the plurality of electrodes are arranged relative to one another so that the light absorbing regions substantially prevent light incident on the optical construction from reaching the electrodes.

Embodiment 66

An optical construction, comprising:
a solar cell comprising a plurality of electrodes extending across the solar cell; and
a light control film disposed on the solar cell and having a plurality of first light absorbing regions, each first light absorbing region having a width W, a height H and a length L, H/W≥1, L/H≥20, each first light absorbing region substantially coextensive and aligned with a corresponding electrode in the plurality of electrodes.

Embodiment 67

The optical construction of embodiment 66, wherein the plurality of electrodes comprises at least one wider electrode and at least one narrower electrode.

Embodiment 68

The optical construction of embodiments 66 or 67, wherein the plurality of first light absorbing regions is substantially embedded in an optical medium substantially transmitting light in a first predetermined wavelength range and having a first index of refraction, each first light absorbing region substantially absorbing light in the first predetermined wavelength range and having a second index of refraction less than the first index of refraction.

Embodiment 69

The optical construction of embodiments 66 to 68, wherein the optical medium transmits at least 70% of light in the first predetermined wavelength range and each first light absorbing region absorbs at least 70% of light in the first predetermined wavelength range.

Embodiment 70

The optical construction of any of embodiments 66 to 69, wherein at least some of the electrodes in the plurality of electrodes are substantially optically opaque.

Embodiment 71

The optical construction of any of embodiments 66 to 70, wherein each first light absorbing region forms an angle with a line normal to the light control film in a range from about 5 degrees to about 40 degrees.

Embodiment 72

An optical construction, comprising:
a solar cell; and
a light control film disposed on the solar cell and substantially coextensive with the solar cell along a length and a width of the light control film, the light control film having a plurality of spaced apart substantially parallel first light absorbing regions, each first light absorbing region having a width W, a height H and a length L, H/W≥1, L/H≥20, each first light absorbing region forming an angle with a line normal to the solar cell in a range from about 5 degrees to about 40 degrees.

Embodiment 73

A light control film comprising a plurality of spaced apart substantially parallel first light absorbing regions and a plurality of spaced apart substantially parallel second light absorbing regions, each first and second light absorbing region having a width W, a height H and a length L, H/W≥1, L/H≥20, each first light absorbing region forming a same first angle with a line normal to a plane of the light control film, each second light absorbing region forming a different same second angle with the line.

Embodiment 74

The light control film of embodiments 17, 44 or 47, further comprising a first image formed thereon for viewing by a viewer.

Embodiment 75

The light control film of embodiments 17, 44 or 47, wherein the first image is formed on both the light absorbing and light transmissive regions.

Embodiment 76

The light control film of embodiments 17, 44 or 47, wherein the first image is formed on the light transmissive, but not the light absorbing, regions.

Embodiment 77

The light control film of embodiments 17, 44 or 47, wherein the first image comprises a printed image.

Embodiment 78

The light control film of embodiments 17, 44 or 47, wherein the first image comprises a camouflaging image or pattern.

Embodiment 79

The light control film of embodiments 17, 44 or 47, disposed adjacent a background displaying a second image, the first image substantially matching the second image thereby substantially camouflaging the light control film.

Various embodiments of the invention have been described. These and other embodiments are within the scope of the following claims.

The invention claimed is:

1. A light control film comprising a plurality of spaced apart substantially parallel first light absorbing regions disposed between major first and second surfaces of the light control film, each first light absorbing region having a width W, a height H in a height direction of the first light absorbing region and a length L, H/W≥1, L/H≥20, each first light absorbing region comprising a multilayer stacked in the height direction of the first light absorbing region, the multilayer comprising a first layer substantially absorbing light in a first predetermined wavelength range and substantially transmitting light in a different second predetermined wavelength range, and a second layer disposed on the first layer and substantially absorbing light in the second predetermined wavelength range and substantially transmitting light in the first predetermined wavelength range.

2. The light control film of claim 1, wherein the first light absorbing regions are at least partially embedded in an optical medium substantially transmitting light in the first and second predetermined wavelength ranges.

3. The light control film of claim 2, wherein the optical medium comprises a first index of refraction and each of the first and second layers comprises a second index of refraction less than the first index of refraction.

4. The light control film of claim 3, wherein a minimum difference between the first and second indices of refraction is 0.1.

5. The light control film of claim 1, wherein the second layers of the first light absorbing regions form one or more of a text message, a word, a letter, a name, an icon, a logo, a symbol, a sign, a trademark, a brand, a sign, an alphanumeric, a picture, an image and an indicium.

6. The light control film of claim 1, wherein the first light absorbing regions extend from the major first surface to the major second surface of the light control film.

7. The light control film of claim 1, wherein each light absorbing region forms an oblique angle with a line normal to a plane of the light control film.

8. The light control film of claim 7, wherein the oblique angle is from about 5 degrees to about 50 degrees.

* * * * *